• US009612530B2

(12) United States Patent
Fujimura et al.

(10) Patent No.: US 9,612,530 B2
(45) Date of Patent: Apr. 4, 2017

(54) METHOD AND SYSTEM FOR DESIGN OF ENHANCED EDGE SLOPE PATTERNS FOR CHARGED PARTICLE BEAM LITHOGRAPHY

(71) Applicant: D2S, Inc., San Jose, CA (US)

(72) Inventors: Akira Fujimura, Saratoga, CA (US); Kazuyuki Hagiwara, Tokyo (JP); Stephen F. Meier, Sunnyvale, CA (US); Ingo Bork, Mountain View, CA (US)

(73) Assignee: D2S, Inc., San Jose, CA (US)

( * ) Notice: Subject to any disclaimer, the term of this patent is extended or adjusted under 35 U.S.C. 154(b) by 0 days.

(21) Appl. No.: 15/068,516

(22) Filed: Mar. 11, 2016

(65) Prior Publication Data

US 2016/0195805 A1 Jul. 7, 2016

Related U.S. Application Data

(63) Continuation-in-part of application No. 14/739,989, filed on Jun. 15, 2015, now abandoned, which is a continuation of application No. 13/037,270, filed on Feb. 28, 2011, now Pat. No. 9,057,956.

(51) Int. Cl.
*G06F 17/50* (2006.01)
*G03F 1/70* (2012.01)
*G03F 7/20* (2006.01)

(52) U.S. Cl.
CPC .............. *G03F 1/70* (2013.01); *G03F 7/2061* (2013.01); *G03F 7/2063* (2013.01); *G06F 17/5009* (2013.01)

(58) Field of Classification Search
USPC ............................ 716/50, 51, 52, 53, 54, 55
See application file for complete search history.

(56) References Cited

U.S. PATENT DOCUMENTS

| 4,264,711 A | 4/1981 | Greeneich |
| 4,634,871 A | 1/1987 | Knauer |
| 4,698,509 A | 10/1987 | Wells et al. |
| 4,818,885 A | 4/1989 | Davis et al. |

(Continued)

FOREIGN PATENT DOCUMENTS

| CN | 1193810 A | 9/1998 |
| EP | 1429368 A2 | 6/2004 |

(Continued)

OTHER PUBLICATIONS

Christophe Pierrat, Ingo Bork ("Impact of Model-Based Fracturing on E-beam Proximity Effect Correction Methodology", Proc. of SPIE vol. 7823, 782313, 2010 SPIE.*

(Continued)

*Primary Examiner* — Brian Ngo
(74) *Attorney, Agent, or Firm* — The Mueller Law Office, P.C.

(57) ABSTRACT

A method and system for fracturing or mask data preparation are presented in which a set of shots is determined for a multi-beam charged particle beam writer. The edge slope of a pattern formed by the set of shots is calculated. An edge of the pattern which has an edge slope below a target level is identified, and the dosage of a beamlet in a shot in the set of shots is increased to improve the edge slope. The improved edge slope remains less than the target level.

16 Claims, 13 Drawing Sheets

(56) References Cited

U.S. PATENT DOCUMENTS

| | | |
|---|---|---|
| 4,825,033 A | 4/1989 | Beasley |
| 5,051,598 A | 9/1991 | Ashton et al. |
| 5,082,762 A | 1/1992 | Takahashi |
| 5,103,101 A | 4/1992 | Berglund et al. |
| 5,173,582 A | 12/1992 | Sakamoto et al. |
| 5,334,282 A | 8/1994 | Nakayama et al. |
| 5,723,237 A | 3/1998 | Kobayashi et al. |
| 5,804,339 A | 9/1998 | Kim |
| 5,825,039 A | 10/1998 | Hartley |
| 5,856,677 A | 1/1999 | Okino |
| 5,885,748 A | 3/1999 | Ohnuma |
| 6,001,513 A | 12/1999 | Hector |
| 6,014,456 A | 1/2000 | Tsudaka |
| 6,087,046 A | 7/2000 | Nakasuji |
| 6,218,671 B1 | 4/2001 | Gordon et al. |
| 6,262,427 B1 | 7/2001 | Gordon |
| 6,291,119 B2 | 9/2001 | Choi et al. |
| 6,298,473 B1 | 10/2001 | Ono et al. |
| 6,372,391 B1 | 4/2002 | Wolfe et al. |
| 6,433,348 B1 | 8/2002 | Abboud et al. |
| 6,557,162 B1 | 4/2003 | Pierrat |
| 6,610,989 B1 | 8/2003 | Takahashi |
| 6,627,366 B2 | 9/2003 | Yang |
| 6,803,589 B2 | 10/2004 | Nakasugi |
| 6,873,938 B1 | 3/2005 | Paxton et al. |
| 6,891,175 B2 | 5/2005 | Hiura |
| 7,150,949 B2 | 12/2006 | Askebjer et al. |
| 7,269,819 B2 | 9/2007 | Hoshino |
| 7,449,700 B2 | 11/2008 | Inanami |
| 7,498,591 B2 | 3/2009 | Lozes et al. |
| 7,504,645 B2 | 3/2009 | Anpo et al. |
| 7,536,664 B2 | 5/2009 | Cohn et al. |
| 7,592,611 B2 | 9/2009 | Kasahara et al. |
| 7,703,069 B1 | 4/2010 | Liu et al. |
| 7,716,627 B1 | 5/2010 | Ungar et al. |
| 7,759,027 B2 | 7/2010 | Fujimura et al. |
| 7,824,828 B2 | 11/2010 | Fujimura et al. |
| 7,901,850 B2 | 3/2011 | Fujimura et al. |
| 7,902,528 B2 | 3/2011 | Hara et al. |
| 8,057,970 B2 | 11/2011 | Fujimura et al. |
| 8,137,871 B2 | 3/2012 | Zable et al. |
| 8,354,207 B2 | 1/2013 | Fujimura et al. |
| 8,473,875 B2 | 6/2013 | Fujimura et al. |
| 8,501,374 B2 | 8/2013 | Fujimura et al. |
| 8,828,628 B2 | 9/2014 | Fujimura |
| 8,900,778 B2 | 12/2014 | Fujimura et al. |
| 9,057,956 B2 | 6/2015 | Fujimura et al. |
| 9,341,936 B2 | 5/2016 | Fujimura |
| 9,372,391 B2 | 6/2016 | Fujimura et al. |
| 2001/0028981 A1 | 10/2001 | Okada et al. |
| 2002/0005494 A1 | 1/2002 | Kamijo et al. |
| 2002/0020824 A1 | 2/2002 | Itoh |
| 2002/0125444 A1 | 9/2002 | Kojima |
| 2002/0129328 A1 | 9/2002 | Komatsuda |
| 2002/0177056 A1 | 11/2002 | Ogino et al. |
| 2003/0043358 A1 | 3/2003 | Suganuma et al. |
| 2003/0044703 A1 | 3/2003 | Yamada |
| 2003/0077530 A1 | 4/2003 | Fujiwara et al. |
| 2003/0082461 A1 | 5/2003 | Carpi |
| 2003/0087191 A1 | 5/2003 | Lavallee et al. |
| 2003/0159125 A1 | 8/2003 | Wang et al. |
| 2003/0203287 A1 | 10/2003 | Miyagawa |
| 2004/0011966 A1 | 1/2004 | Sasaki et al. |
| 2004/0099636 A1 | 5/2004 | Scipioni |
| 2004/0131977 A1 | 7/2004 | Martyniuk et al. |
| 2004/0205684 A1 | 10/2004 | Gothoskar et al. |
| 2004/0229133 A1 | 11/2004 | Socha et al. |
| 2005/0053850 A1 | 3/2005 | Askebjer et al. |
| 2005/0076322 A1 | 4/2005 | Ye et al. |
| 2005/0097500 A1 | 5/2005 | Ye et al. |
| 2005/0211921 A1 | 9/2005 | Wieland et al. |
| 2005/0221204 A1 | 10/2005 | Kimura |
| 2006/0073686 A1 | 4/2006 | Zach et al. |
| 2006/0085773 A1 | 4/2006 | Zhang |
| 2006/0126046 A1 | 6/2006 | Hansen |
| 2006/0218520 A1 | 9/2006 | Pierrat et al. |
| 2007/0114463 A1 | 5/2007 | Nakasugi et al. |
| 2007/0194250 A1 | 8/2007 | Suzuki et al. |
| 2007/0196768 A1 | 8/2007 | Ogino |
| 2007/0280526 A1 | 12/2007 | Malik et al. |
| 2008/0050676 A1 | 2/2008 | Hoshino |
| 2008/0054196 A1 | 3/2008 | Hiroshima |
| 2008/0116398 A1 | 5/2008 | Hara et al. |
| 2008/0203324 A1 | 8/2008 | Fujimura et al. |
| 2008/0213677 A1 | 9/2008 | Saito |
| 2009/0200495 A1 | 8/2009 | Platzgummer |
| 2009/0297958 A1 | 12/2009 | Lee et al. |
| 2009/0306805 A1 | 12/2009 | Kyoh |
| 2009/0325085 A1 | 12/2009 | Yoshida et al. |
| 2010/0055580 A1 | 3/2010 | Fujimura et al. |
| 2010/0055581 A1 | 3/2010 | Fujimura et al. |
| 2010/0055585 A1 | 3/2010 | Fujimura et al. |
| 2010/0055586 A1 | 3/2010 | Fujimura et al. |
| 2010/0058279 A1 | 3/2010 | Fujimura et al. |
| 2010/0058281 A1 | 3/2010 | Fujimura et al. |
| 2010/0058282 A1 | 3/2010 | Fujimura et al. |
| 2010/0148087 A1 | 6/2010 | Doering et al. |
| 2010/0183963 A1 | 7/2010 | Zable et al. |
| 2010/0209834 A1 | 8/2010 | Yao et al. |
| 2010/0251202 A1 | 9/2010 | Pierrat |
| 2010/0264335 A1 | 10/2010 | Hoyle et al. |
| 2010/0315611 A1 | 12/2010 | Kato |
| 2010/0325595 A1 | 12/2010 | Song et al. |
| 2011/0033788 A1 | 2/2011 | Kato |
| 2011/0053056 A1 | 3/2011 | Fujimura et al. |
| 2011/0053093 A1 | 3/2011 | Hagiwara et al. |
| 2011/0089344 A1 | 4/2011 | Fujimura et al. |
| 2011/0089345 A1 | 4/2011 | Komagata et al. |
| 2011/0116067 A1 | 5/2011 | Ye et al. |
| 2011/0145769 A1 | 6/2011 | Wei |
| 2011/0159435 A1 | 6/2011 | Zable et al. |
| 2011/0177458 A1 | 7/2011 | Kotani et al. |
| 2012/0047474 A1 | 2/2012 | Choi et al. |
| 2012/0084740 A1 | 4/2012 | Fujimura et al. |
| 2012/0096412 A1 | 4/2012 | Fujimura et al. |
| 2012/0149133 A1 | 6/2012 | Parrish et al. |
| 2012/0151428 A1 | 6/2012 | Tanaka et al. |
| 2012/0217421 A1 | 8/2012 | Fujimura et al. |
| 2012/0221980 A1 | 8/2012 | Fujimura et al. |
| 2012/0221985 A1 | 8/2012 | Fujimura |
| 2012/0329289 A1 | 12/2012 | Fujimura et al. |
| 2013/0070222 A1 | 3/2013 | Fujimura |
| 2013/0283216 A1 | 10/2013 | Pearman et al. |
| 2013/0283218 A1 | 10/2013 | Fujimura et al. |
| 2015/0338737 A1 | 11/2015 | Fujimura et al. |

FOREIGN PATENT DOCUMENTS

| | | |
|---|---|---|
| EP | 2302659 A2 | 3/2011 |
| GB | 2367908 | 4/2002 |
| JP | S5425675 A | 2/1979 |
| JP | S54025675 | 2/1979 |
| JP | S608844 A | 1/1985 |
| JP | 61105839 | 5/1986 |
| JP | 63007631 | 1/1988 |
| JP | H02280315 A | 11/1990 |
| JP | 03205815 | 9/1991 |
| JP | H03205815 A | 9/1991 |
| JP | 04058518 | 2/1992 |
| JP | 04096065 | 3/1992 |
| JP | 1992155337 | 5/1992 |
| JP | 04196516 | 7/1992 |
| JP | 4196516 A | 7/1992 |
| JP | H04196516 A | 7/1992 |
| JP | H04307723 A | 10/1992 |
| JP | 05036595 | 2/1993 |
| JP | H0536595 A | 2/1993 |
| JP | H05036595 | 2/1993 |
| JP | 05114549 | 5/1993 |
| JP | 05198483 | 8/1993 |
| JP | 05267132 | 10/1993 |
| JP | 05267133 | 10/1993 |
| JP | H05267133 A | 10/1993 |
| JP | H05335221 A | 12/1993 |

(56) References Cited

FOREIGN PATENT DOCUMENTS

| | | |
|---|---|---|
| JP | H0620931 A | 1/1994 |
| JP | H06020931 | 1/1994 |
| JP | 06124883 | 5/1994 |
| JP | 06252036 | 9/1994 |
| JP | 08055771 | 2/1996 |
| JP | 8555771 | 2/1996 |
| JP | H0855771 A | 2/1996 |
| JP | 08064522 | 3/1996 |
| JP | H08195339 A | 7/1996 |
| JP | 8222504 | 8/1996 |
| JP | H08222504 A | 8/1996 |
| JP | H09034095 | 2/1997 |
| JP | H09266153 A | 10/1997 |
| JP | 10294255 | 11/1998 |
| JP | H11111594 A | 4/1999 |
| JP | 11233401 | 8/1999 |
| JP | 2000012426 A | 1/2000 |
| JP | 2000066366 A | 3/2000 |
| JP | 2000091191 A | 3/2000 |
| JP | 2000123768 A | 4/2000 |
| JP | 2000138165 A | 5/2000 |
| JP | 2000269123 A | 9/2000 |
| JP | 2001013671 A | 1/2001 |
| JP | 2001093809 A | 4/2001 |
| JP | 2001203157 A | 7/2001 |
| JP | 2001230203 A | 8/2001 |
| JP | 2001305720 A | 11/2001 |
| JP | 2001313253 A | 11/2001 |
| JP | 2002008966 | 1/2002 |
| JP | 2002075830 A | 3/2002 |
| JP | 2002110508 A | 4/2002 |
| JP | 2002151387 A | 5/2002 |
| JP | 2002202590 A | 7/2002 |
| JP | 2002217092 A | 8/2002 |
| JP | 2002351055 A | 12/2002 |
| JP | 2003195511 A | 7/2003 |
| JP | 2003315976 A | 11/2003 |
| JP | 2003338460 A | 11/2003 |
| JP | 2003347192 | 12/2003 |
| JP | 2004063546 | 2/2004 |
| JP | 2004088071 A | 3/2004 |
| JP | 2004134447 A | 4/2004 |
| JP | 2004134574 A | 4/2004 |
| JP | 2004170410 A | 6/2004 |
| JP | 2004273526 A | 9/2004 |
| JP | 2004304031 A | 10/2004 |
| JP | 2004356440 A | 12/2004 |
| JP | 2005079111 A | 3/2005 |
| JP | 2005094015 | 4/2005 |
| JP | 2006032814 A | 2/2006 |
| JP | 2006059348 A | 3/2006 |
| JP | 2006100336 A | 4/2006 |
| JP | 2006100409 A | 4/2006 |
| JP | 2006108447 A | 4/2006 |
| JP | 2006222230 A | 8/2006 |
| JP | 2006294794 A | 10/2006 |
| JP | 2007041090 A | 2/2007 |
| JP | 2007103923 A | 4/2007 |
| JP | 2007242710 A | 9/2007 |
| JP | 2007249167 | 9/2007 |
| JP | 2007258659 | 10/2007 |
| JP | 2007305880 A | 11/2007 |
| JP | 2008053565 A | 3/2008 |
| JP | 2008066441 A | 3/2008 |
| JP | 2008096486 A | 4/2008 |
| JP | 2009147254 A | 7/2009 |
| JP | 2010062562 A | 3/2010 |
| JP | 2011040716 A | 2/2011 |
| JP | 2011049556 | 3/2011 |
| JP | 2011197520 A | 10/2011 |
| JP | 2012501474 A | 1/2012 |
| KR | 20030091754 | 12/2003 |
| KR | 1020070082031 | 8/2007 |
| TW | 495834 B | 7/2002 |
| TW | I222100 B | 10/2004 |
| TW | I233149 B | 5/2005 |
| TW | 200523524 | 7/2005 |
| TW | 200604763 A | 2/2006 |
| TW | 200606602 | 2/2006 |
| TW | 200700932 | 1/2007 |
| TW | I291083 B | 12/2007 |
| TW | 200832080 A | 8/2008 |
| TW | 200834366 A | 8/2008 |
| TW | 200900880 A | 1/2009 |
| WO | 03036386 A | 5/2003 |
| WO | 2004008508 A1 | 1/2004 |
| WO | 2004077156 A | 9/2004 |
| WO | 2007030528 A2 | 3/2007 |
| WO | 2008064155 A | 5/2008 |
| WO | 2010025031 A2 | 3/2010 |
| WO | 2010025032 A | 3/2010 |
| WO | 2010025060 A2 | 3/2010 |
| WO | 2011021346 A1 | 2/2011 |
| WO | 2011049740 A1 | 4/2011 |

OTHER PUBLICATIONS

Notice of Allowance dated Jun. 13, 2016 for U.S. Appl. No. 14/715,136.
Office Action dated Aug. 18, 2016 for Republic of Korea Patent Application No. 10-2011-7007654.
Office Action dated Aug. 23, 2016 for Japanese Patent Application No. 2013-556643.
Office Action dated Aug. 29, 2016 for Republic of Korea Patent Application No. 10-2009-0081187.
Office Action dated Aug. 29, 2016 for U.S. Appl. No. 15/157,190.
Office Action dated Aug. 31, 2016 for U.S. Appl. No. 15/184,099.
Office Action dated Jul. 26, 2016 for Japanese Patent Application No. 2014-530723.
Office Action dated Jul. 4, 2016 for Republic of Korea Patent Application No. 10-2014-7036547.
Official Letter and Search Report dated Jun. 13, 2016 for Taiwan Patent Application No. 101105804.
European Search Report dated Nov. 17, 2015 for EP Patent Application No. 09810441.7.
Extended European Search Report dated Jul. 20, 2015 for European Patent Application No. 12833285.5.
Extended European Search Report dated Jul. 23, 2015 for European Patent Application No. 12804558.0.
Hagiwara et al., Model-Based Mask Data Preparation (MB-MDP) for ArF and EUV Mask Process Correction, Photomask and Next-Generation Lithography Mask Technology XVIII, SPIE, vol. 8081, No. 1, Apr. 2011, pp. 1-8.
Leunissen et al., "Experimental and simulation comparison of electron-beam proximity correction". Journal of Vacuum Science & Technology B 22(6), Nov. 2004, pp. 2943-2947.
Notice of Allowance and Fees dated Jan. 21, 2015 for U.S. Appl. No. 14/257,874.
Notice of Allowance and Fees dated Jan. 23, 2015 for U.S. Appl. No. 13/862,476.
Notice of Allowance and Fees dated Jan. 26, 2015 for U.S. Appl. No. 14/106,584.
Notice of Allowance and Fees dated Jun. 23, 2015 for U.S. Appl. No. 14/578,060.
Notice of Allowance and Fees dated Oct. 14, 2015 for U.S. Appl. No. 14/552,360.
Notice of Allowance dated Mar. 22, 2011 for U.S. Appl. No. 12/603,580.
Notice of Allowance dated Dec. 24, 2015 for U.S. Appl. No. 14/177,679.
Notice of Allowance dated Feb. 22, 2016 for U.S. Appl. No. 14/809,188.
Notice of Allowance dated Jan. 25, 2016 for U.S. Appl. No. 14/177,688.
Notice of Allowance dated Mar. 18, 2016 for U.S. Appl. No. 13/862,475.
Notice of Allowance dated May 24, 2016 for U.S. Appl. No. 14/970,505.

(56) References Cited

OTHER PUBLICATIONS

Notice of Allowance dated Oct. 23, 2015 for U.S. Appl. No. 14/479,520.
Notice of Allowance mailed Jan. 20, 2016 for U.S. Appl. No. 14/331,008.
Office Action dated Mar. 24, 2011 for U.S. Appl. No. 12/618,722.
Office Action dated Aug. 18, 2015 for Japanese Patent Application No. 2014-248818.
Office Action dated Aug. 20, 2015 for U.S. Appl. No. 13/862,475.
Office Action dated Dec. 16, 2015 for Republic of Korea Patent Application No. 10-2011-7007511.
Office Action dated Dec. 21, 2015 for Republic of Korea Patent Application No. 10-2014-7036547.
Office Action dated Feb. 11, 2016 for U.S. Appl. No. 13/862,471.
Office Action dated Feb. 11, 2016 for U.S. Appl. No. 14/970,505.
Office Action dated Feb. 6, 2015 for U.S Appl. No. 13/862,475.
Office Action dated Jan. 11, 2016 for Republic of Korea Patent Application No. 10-2011-7007654.
Office Action dated Jan. 15, 2016 for Republic of Korea Patent Application No. 10-2009-0081187.
Office Action dated Jan. 20, 2015 for Japanese Patent Application No. 2012-535223.
Office Action dated Jan. 6, 2015 for Japanese Patent Application No. 2010-183857.
Office Action dated Jul. 27, 2015 for U.S. Appl. No. 14/331,008.
Office Action dated Jul. 8, 2014 for Japanese Patent Application No. 2009-200191.
Office Action dated Jun. 15, 2015 for U.S. Appl. No. 14/578,410.
Office Action dated Jun. 19, 2015 for U.S. Appl. No. 13/862,471.
Office Action dated Jun. 25, 2015 for U.S. Appl. No. 14/552,360.
Office Action dated Mar. 3, 2015 for Japanese Patent Application No. 2011-525090.
Office Action dated May 12, 2015 for Korean Patent Application No. 10-2014-7036547.
Office Action dated May 17, 2012 for U.S. Appl. No. 13/037,270.
Office Action Dated Nov. 5, 2012 for U.S Appl. No. 13/037,270.
Office Action dated Oct. 20, 2015 for U.S. Appl. No. 14/454,140.
Office Action dated Oct. 29, 2013 for U.S. Appl. No. 13/037,270.
Office Action dated Oct. 6, 2015 for Japanese Patent Application No. 2013-556643.
Office Action dated Sep. 11, 2015 for U.S. Appl. No. 14/177,688.
Office Action dated Sep. 15, 2015 for Japanese Patent Application No. 2014-245829.
Office Action dated Sep. 21, 2015 for U.S. Appl. No. 14/177,679.
Office Action dated Sep. 29, 2015 for U.S. Appl. No. 14/715,136.
Official Letter and Search Report dated Apr. 10, 2015 for Taiwanese Patent Application No. 98128034.
Official Letter and Search Report dated Apr. 13, 2015 for Taiwanese Patent Application No. TW 100136720.
Official letter and search report dated Apr. 29, 2015 for Taiwanese Application No. 99127100.
Official Letter and Search Report dated Oct. 21, 2015 for Taiwanese Patent Application 101122222.
Pierrat et al, Mask Data Correction Methodology in the Context of Model-Based Fracturing and Advanced Mask Models, Optical Microlithography XXIV, SPIE, vol. 7973, No. 1, Mar. 2011, pp. 1-11.
Quickle et al., Spot Overlap in a Variable Shaped Shpot Electroni Beam Exposure Tool, IP.com Journal, IP.Com Inc., West Henrietta, NY, USA, Jun. 1, 1981 pp. 1-3.
Sakakibara et al., Variable-shaped Electron-Beam Direct Writing Technology for 1-Mum VSI Fabrication, IEEE Transactions on Electron Devices, IEEE Service Center, New Jersey, US, vol. 28, No. 11, Nov. 1, 1981, pp. 1279-1284.
Search Report dated Dec. 24, 2015 for Taiwanese Patent Application No. 101134276.
Chinese Office Action dated Sep. 11, 2013 for Chinese Application No. 200980134188.6.
International Search Report and Written Opinion dated Oct. 18, 2012 for PCT Patent Application No. PCT/US2012/025149.
International Search Report and Written Opinion dated Oct. 23, 2012 for PCT Application No. PCT/US2012/025148.
International Search Report and Written Opinion dated Sep. 17, 2012 for PCT Application No. PCT/US2012/025328.
Japanese Office Action dated Aug. 20, 2013 for Japanese Patent Application No. 2011-525073.
Japanese Office Action dated Oct. 1, 2013 for Japanese Patent Application No. 2011-525090.
Japanese Office Action dated Oct. 8, 2013 for Japanese Patent Application No. 2011-525091.
Martin, L. et al., "Development of Multiple Pass Exposure in Electron Beam Direct Write Lithography for Sub-32nm Nodes", Proceedings of SPIE, vol. 7488 (Sep. 29, 2009), pp. 74881C-1-74881C-12, SPIE, P.O. Box 10, Bellingham, WA. 98227, U.S.A.
Martin, L. et al., "New Writing Strategy in Electron Beam Direct Write Lithography to Improve Critical Dense Lines Patterning for Sub-45nm Nodes", Proceedings of SPIE, vol. 7470 (Jan. 29, 2009), pp. 74700R-1-74700R-12, SPIE, P.O. Box 10, Bellingham, WA. 98227, U.S.A.
Notice of Allowance and Fee(s) dated Oct. 11, 2013 for U.S. Appl. No. 13/923,368.
Notice of Allowance and Fees dated Aug. 1, 2014 for U.S Appl. No. 14/108,135.
Notice of Allowance and Fees dated Aug. 15, 2014 for U.S. Appl. No. 13/959,530.
Notice of Allowance and Fees dated Aug. 2, 2013 for U.S Appl. No. 13/710,426.
Notice of Allowance and Fees dated Aug. 23, 2013 for U.S. Appl. No. 13/723,181.
Notice of Allowance and Fees dated Dec. 26, 2013 for U.S. Appl. No. 13/862,472.
Notice of Allowance and Fees dated Jul. 23, 2014 for U.S. Appl. No. 13/970,465.
Notice of Allowance and Fees dated Mar. 20, 2014 for U.S. Appl. No. 13/970,465.
Notice of Allowance and Fees dated Mar. 27, 2015 for U.S. Appl. No. 13/948,725.
Notice of Allowance and Fees dated Oct. 10, 2014 for U.S. Appl. No. 13/801,554.
Office Action dated Mar. 31, 2011 for U.S. Appl. No. 12/750,709.
Office Action dated Apr. 15, 2014 for Japanese Patent Application No. 2011-525072.
Office Action dated Apr. 20, 2016 for U.S. Appl. No. 14/715,136.
Office Action dated Apr. 22, 2016 for U.S. Appl. No. 14/454,140.
Office Action dated Apr. 26, 2016 for Japanese Patent Application No. 2014-517074.
Office Action dated Apr. 3, 2014 for Chinese patent application No. 200980134188.6.
Office Action dated Aug. 16, 2012 for U.S. Appl. No. 13/329,315.
Office Action dated Aug. 5, 2014 for Japanese Patent Application No. 2011-525091.
Office Action dated Dec. 16, 2014 for U.S. Appl. No. 13/948,725.
Office Action dated Feb. 14, 2014 for U.S. Appl. No. 13/631,941.
Office Action dated Feb. 27, 2014 for U.S. Appl. No. 13/236,610.
Office Action Dated Jan. 16, 2013 for U.S. Appl. No. 13/037,268.
Office Action dated Jan. 25, 2013 for U.S. Appl. No. 13/329,314.
Office Action dated Jul. 23, 2013 for Japanese Patent Application No. 2009-200191.
Office Action dated Jul. 23, 2013 for Japanese Patent Application No. 2011-525072.
Office Action dated Jul. 8, 2015 for U.S. Appl. No. 14/479,520.
Office Action dated Jun. 3, 2014 for Japanese Patent Application No. 2012-526931.
Office Action dated Jun. 10, 2014 for Japanese Patent Application No. 2011-525090.
Office Action dated Jun. 10, 2014 for JP Patent Application No. 2011-525073.
Office Action dated Jun. 22, 2012 for U.S. Appl. No. 13/037,268.
Office Action dated Jun. 3, 2014 for Japanese Patent Application No. 2012-535220.
Office Action dated Jun. 6, 2014 for U.S. Appl. No. 13/329,315.
Office Action dated Mar. 11, 2014 for U.S. Appl. No. 13/959,530.
Office Action dated Mar. 13, 2014 for U.S Appl. No. 13/862,476.

(56) References Cited

OTHER PUBLICATIONS

Office Action dated Mar. 27, 2015 for U.S Appl. No. 14/454,140.
Office Action dated May 9, 2014 for U.S. Appl. No. 14/106,584.
Office Action dated May 1, 2014 for U.S. Appl. No. 13/862,471.
Office Action dated May 1, 2016 for Republic of Korea Patent Application No. 10-2010-0083145.
Office Action dated May 13, 2014 for Japanese Patent Application No. 2010-183857.
Office Action dated May 16, 2014 for U.S. Appl. No. 13/948,725.
Office Action dated May 24, 2013 for U.S. Appl. No. 13/329,315.
Office Action dated May 24, 2016 for U.S. Appl. No. 13/894,349.
Office Action dated May 27, 2014 for Japanese Patent Application No. 2012-535223.
Office Action dated May 5, 2014 for U.S. Appl. No. 13/862,475.
Office Action dated Nov. 11, 2014 for Japanese Patent Application No. 2012-526931.
Office Action dated Oct. 15, 2014 for U.S. Appl. No. 13/862,476.
Office Action dated Oct. 20, 2014 for U.S. Appl. No. 13/862,471.
Office Action dated Oct. 24, 2014 for U.S. Appl. No. 14/106,584.
Office Action dated Oct. 25, 2013 for U.S. Appl. No. 13/037,263.
Office Action dated Oct. 6, 2014 for U.S. Appl. No. 14/331,008.
Office Action dated Sep. 10, 2013 for U.S. Appl. No. 13/329,314.
Office Action dated Sep. 11, 2015 for U.S. Appl. No. 14/739,989.
Office Action dated Sep. 24, 2013 for U.S. Appl. No. 13/329,315.
Official Letter and Search Report dated Aug. 21, 2014 for Taiwanese Patent Application No. 098128359.
Official letter and search report dated Aug. 6, 2014 for Taiwanese Patent Application No. 099127553.
Official Letter and Search Report dated Oct. 24, 2014 for Taiwanese Patent Application No. 099134187.
Official Letter and Search Report dated Sep. 25, 2014 for Taiwanese Patent Application No. 099134186.
Official Letter and Search Report dated Sep. 25, 2014 for Taiwanese Patent Application No. 98128360.
Search Report dated Apr. 9, 2014 for Taiwanese Application No. 98128358.
Notice of Allowance dated Dec. 20, 2016 for U.S. Appl. No. 15/184,099.
Office Action dated Dec. 13, 2016 for Japanese Patent Application No. 2015-507093.
Official Letter and Search Report dated Dec. 15, 2016 for Taiwan Patent Application No. 102113610.
Official Letter and Search Report dated Dec. 15, 2016 for Taiwan Patent Application No. 102113633.

* cited by examiner

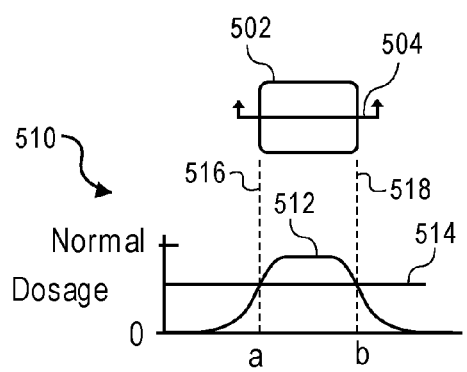
FIG. 5A
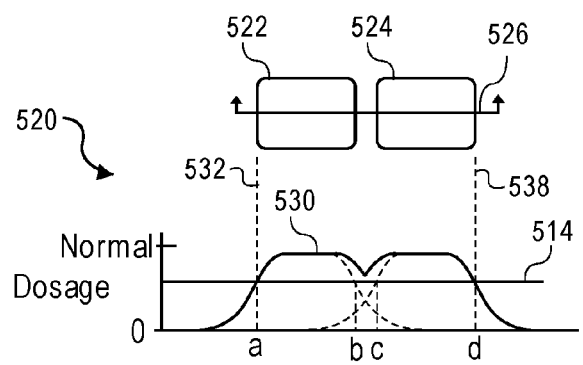 
FIG. 5B
FIG. 5C

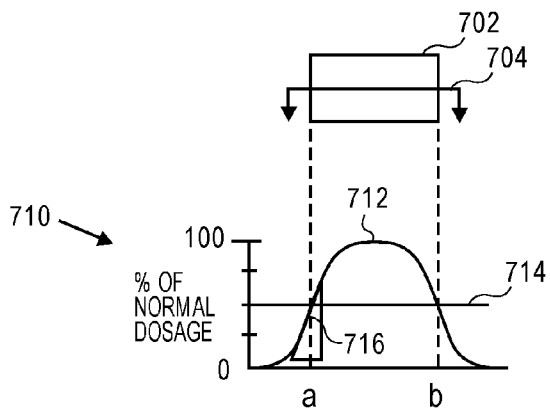
FIG. 7A
FIG. 7B
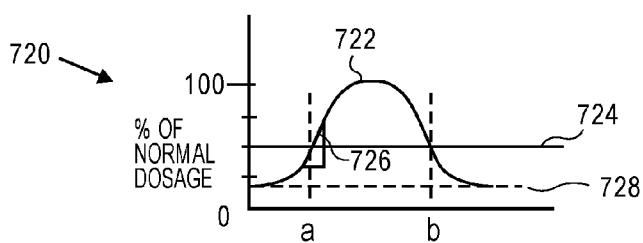
FIG. 7C
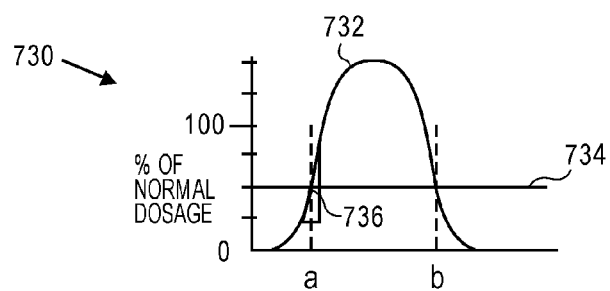
FIG. 7D
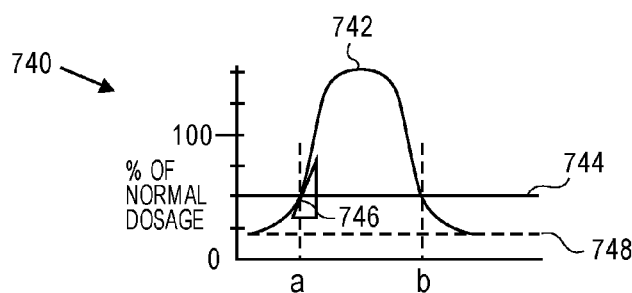
FIG. 7E
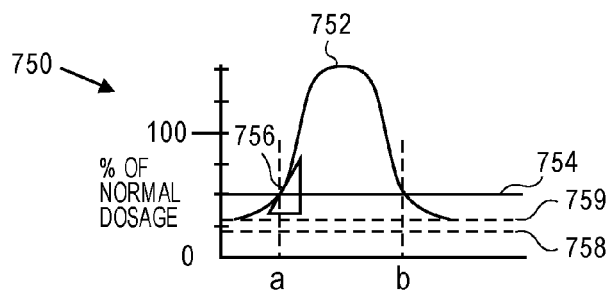
FIG. 7F

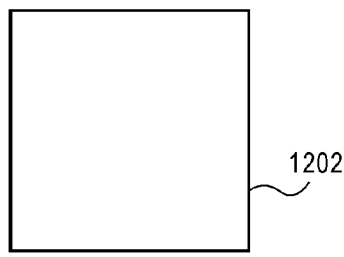
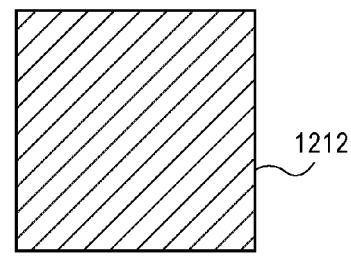
FIG. 12A    FIG. 12B
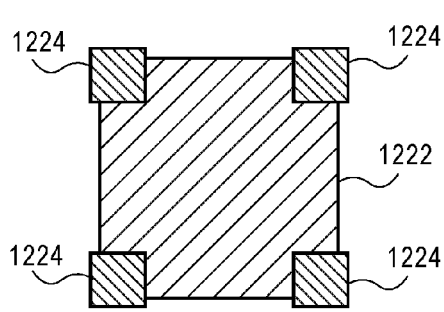
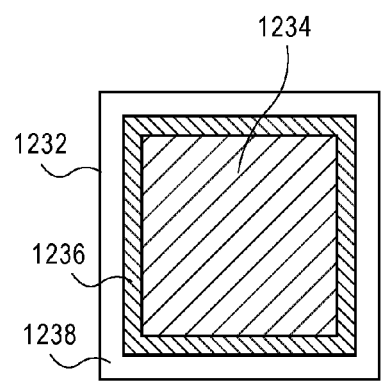
FIG. 12C    FIG. 12D

METHOD AND SYSTEM FOR DESIGN OF ENHANCED EDGE SLOPE PATTERNS FOR CHARGED PARTICLE BEAM LITHOGRAPHY

RELATED APPLICATIONS

This application: 1) is a continuation-in-part of U.S. patent application Ser. No. 14/739,989, filed on Jun. 15, 2015 and entitled "Method and System for Design of Enhanced Edge Slope Patterns for Charged Particle Beam Lithography"; which 2) is a continuation of U.S. patent application Ser. No. 13/037,270, filed on Feb. 28, 2011, entitled "Method and System for Design of Enhanced Edge Slope Patterns for Charged Particle Beam Lithography" and issued as U.S. Pat. No. 9,057,956; which are hereby incorporated by reference for all purposes. This application also is related to Fujimura, U.S. patent application Ser. No. 13/037,263, entitled "Method and System For Design Of A Surface To Be Manufactured Using Charged Particle Beam Lithography," filed on Feb. 28, 2011; and is related to Fujimura, U.S. patent application Ser. No. 13/037,268, entitled "Method and System For Design Of Enhanced Accuracy Patterns For Charged Particle Beam Lithography," filed on Feb. 28, 2011; both of which are hereby incorporated by reference for all purposes.

BACKGROUND OF THE DISCLOSURE

The present disclosure is related to lithography, and more particularly to the design and manufacture of a surface which may be a reticle, a wafer, or any other surface, using charged particle beam lithography.

In the production or manufacturing of semiconductor devices, such as integrated circuits, optical lithography may be used to fabricate the semiconductor devices. Optical lithography is a printing process in which a lithographic mask or photomask or reticle is used to transfer patterns to a substrate such as a semiconductor or silicon wafer to create the integrated circuit (I.C.). Other substrates could include flat panel displays, holographic masks or even other reticles. Conventional optical lithography typically uses radiation of 193 nm wavelength or longer. Extreme ultraviolet (EUV) or X-ray lithography are also considered types of optical lithography, but use wavelengths much shorter than the 193 nm of conventional optical lithography. The reticle or multiple reticles may contain a circuit pattern corresponding to an individual layer of the integrated circuit, and this pattern can be imaged onto a certain area on the substrate that has been coated with a layer of radiation-sensitive material known as photoresist or resist. Once the patterned layer is transferred the layer may undergo various other processes such as etching, ion-implantation (doping), metallization, oxidation, and polishing. These processes are employed to finish an individual layer in the substrate. If several layers are required, then the whole process or variations thereof will be repeated for each new layer. Eventually, a combination of multiples of devices or integrated circuits will be present on the substrate. These integrated circuits may then be separated from one another by dicing or sawing and then may be mounted into individual packages. In the more general case, the patterns on the substrate may be used to define artifacts such as display pixels, holograms, directed self-assembly (DSA) guard bands, or magnetic recording heads. Conventional optical lithography writing machines typically reduce the photomask pattern by a factor of four during the optical lithographic process. Therefore, patterns formed on the reticle or mask must be four times larger than the size of the desired pattern on the substrate or wafer.

In the production or manufacturing of semiconductor devices, such as integrated circuits, non-optical methods may be used to transfer a pattern on a lithographic mask to a substrate such as a silicon wafer. Nanoimprint lithography (NIL) is an example of a non-optical lithography process. In nanoimprint lithography, a lithographic mask pattern is transferred to a surface through contact of the lithography mask with the surface.

In the production or manufacturing of semiconductor devices, such as integrated circuits, maskless direct write may also be used to fabricate the semiconductor devices. Maskless direct write is a printing process in which charged particle beam lithography is used to transfer patterns to a substrate such as a semiconductor or silicon wafer to create the integrated circuit. Other substrates could include flat panel displays, imprint masks for nano-imprinting, or even reticles. Desired patterns of a layer are written directly on the surface, which in this case is also the substrate. Once the patterned layer is transferred the layer may undergo various other processes such as etching, ion-implantation (doping), metallization, oxidation, and polishing. These processes are employed to finish an individual layer in the substrate. If several layers are required, then the whole process or variations thereof will be repeated for each new layer. Some of the layers may be written using optical lithography while others may be written using maskless direct write to fabricate the same substrate. Also, some patterns of a given layer may be written using optical lithography, and other patterns written using maskless direct write. Eventually, a combination of multiples of devices or integrated circuits will be present on the substrate. These integrated circuits are then separated from one another by dicing or sawing and then mounted into individual packages. In the more general case, the patterns on the surface may be used to define artifacts such as display pixels, holograms, or magnetic recording heads.

Two common types of charged particle beam lithography are variable shaped beam (VSB) and character projection (CP). These are both sub-categories of shaped beam charged particle beam lithography, in which a precise electron beam is shaped and steered so as to expose a resist-coated surface, such as the surface of a wafer or the surface of a reticle. In VSB, these shapes are simple shapes, usually limited to rectangles of certain minimum and maximum sizes and with sides which are parallel to the axes of a Cartesian coordinate plane (i.e. of "manhattan" orientation), and 45 degree right triangles (i.e. triangles with their three internal angles being 45 degrees, 45 degrees, and 90 degrees) of certain minimum and maximum sizes. At predetermined locations, doses of electrons are shot into the resist with these simple shapes. The total writing time for this type of system increases with the number of shots. In character projection (CP), there is a stencil in the system that has in it a variety of apertures or characters which may be complex shapes such as rectilinear, arbitrary-angled linear, circular, nearly circular, annular, nearly annular, oval, nearly oval, partially circular, partially nearly circular, partially annular, partially nearly annular, partially nearly oval, or arbitrary curvilinear shapes, and which may be a connected set of complex shapes or a group of disjointed sets of a connected set of complex shapes. An electron beam can be shot through a character on the stencil to efficiently produce more complex patterns on the reticle. In theory, such a system can be faster than a VSB system because it can shoot more complex shapes with each time-consuming shot. Thus, an E-shaped pattern shot with a VSB system takes four shots, but the same E-shaped pattern can be shot with one shot with a character projection system. Note that VSB systems can be thought of as a special (simple) case of character projection, where the characters are just simple characters, usually rectangles or 45 degree right triangles. It is also possible to partially expose a character. This can be done by, for instance, blocking part of the particle beam. For example, the E-shaped pattern described above can be partially exposed as an F-shaped pattern or an I-shaped pattern, where different parts of the beam are cut off by an aperture. This is the same mechanism as how various sized rectangles can be shot using VSB. In this disclosure, partial projection is used to mean both character projection and VSB projection. Shaped beam charged particle beam lithography may use either a single shaped beam, or may use a plurality of shaped beams simultaneously exposing the surface, the plurality of shaped beams producing a higher writing speed than a single shaped beam.

As indicated, in lithography the lithographic mask or reticle comprises geometric patterns corresponding to the circuit components to be integrated onto a substrate. The patterns used to manufacture the reticle may be generated utilizing computer-aided design (CAD) software or programs. In designing the patterns the CAD program may follow a set of pre-determined design rules in order to create the reticle. These rules are set by processing, design, and end-use limitations. An example of an end-use limitation is defining the geometry of a transistor in a way in which it cannot sufficiently operate at the required supply voltage. In particular, design rules can define the space tolerance between circuit devices or interconnect lines. The design rules are, for example, used to ensure that the circuit devices or lines do not interact with one another in an undesirable manner. For example, the design rules are used so that lines do not get too close to each other in a way that may cause a short circuit. The design rule limitations reflect, among other things, the smallest dimensions that can be reliably fabricated. When referring to these small dimensions, one usually introduces the concept of a critical dimension. These are, for instance, defined as the smallest width of a line or the smallest space between two lines, those dimensions requiring exquisite control.

One goal in integrated circuit fabrication by optical lithography is to reproduce the original circuit design on the substrate by use of the reticle. Integrated circuit fabricators are always attempting to use the semiconductor wafer real estate as efficiently as possible. Engineers keep shrinking the size of the circuits to allow the integrated circuits to contain more circuit elements and to use less power. As the size of an integrated circuit critical dimension is reduced and its circuit density increases, the critical dimension of the circuit pattern or physical design approaches the resolution limit of the optical exposure tool used in conventional optical lithography. As the critical dimensions of the circuit pattern become smaller and approach the resolution value of the exposure tool, the accurate transcription of the physical design to the actual circuit pattern developed on the resist layer becomes difficult. To further the use of optical lithography to transfer patterns having features that are smaller than the light wavelength used in the optical lithography process, a process known as optical proximity correction (OPC) has been developed. OPC alters the physical design to compensate for distortions caused by effects such as optical diffraction and the optical interaction of features with proximate features. OPC includes all resolution enhancement technologies performed with a reticle.

OPC may add sub-resolution lithographic features to mask patterns to reduce differences between the original physical design pattern, that is, the design, and the final transferred circuit pattern on the substrate. The sub-resolution lithographic features interact with the original patterns in the physical design and with each other and compensate for proximity effects to improve the final transferred circuit pattern. One feature that is used to improve the transfer of the pattern is a sub-resolution assist feature (SRAF). Another feature that is added to improve pattern transference is referred to as "serifs". Serifs are small features that can be positioned on a corner of a pattern to sharpen the corner in the final transferred image. It is often the case that the precision demanded of the surface manufacturing process for SRAFs are less than those for patterns that are intended to print on the substrate, often referred to as main features. Serifs are a part of a main feature. As the limits of optical lithography are being extended far into the sub-wavelength regime, the OPC features must be made more and more complex in order to compensate for even more subtle interactions and effects. As imaging systems are pushed closer to their limits, the ability to produce reticles with sufficiently fine OPC features becomes critical. Although adding serifs or other OPC features to a mask pattern is advantageous, it also substantially increases the total feature count in the mask pattern. For example, adding a serif to each of the corners of a square using conventional techniques adds eight more rectangles to a mask or reticle pattern. Adding OPC features is a very laborious task, requires costly computation time, and results in more expensive reticles. Not only are OPC patterns complex, but since optical proximity effects are long range compared to minimum line and space dimensions, the correct OPC patterns in a given location depend significantly on what other geometry is in the neighborhood. Thus, for instance, a line end will have different size serifs depending on what is near it on the reticle. This is even though the objective might be to produce exactly the same shape on the wafer. These slight but critical variations are important and have prevented others from being able to form reticle patterns. It is conventional to discuss the OPC-decorated patterns to be written on a reticle in terms of main features, that is features that reflect the design before OPC decoration, and OPC features, where OPC features might include serifs, jogs, and SRAF. To quantify what is meant by slight variations, a typical slight variation in OPC decoration from neighborhood to neighborhood might be 5% to 80% of a main feature size. Note that for clarity, variations in the design of the OPC are what is being referenced. Manufacturing variations, such as line-edge roughness and corner rounding, will also be present in the actual surface patterns. When these OPC variations produce substantially the same patterns on the wafer, what is meant is that the geometry on the wafer is targeted to be the same within a specified error, which depends on the details of the function that that geometry is designed to perform, e.g., a transistor or a wire. Nevertheless, typical specifications are in the 2%-50% of a main feature range. There are numerous manufacturing factors that also cause variations, but the OPC component of that overall error is often in the range listed. OPC shapes such as sub-resolution assist features are subject to various design rules, such as a rule based on the size of the smallest feature that can be transferred to the wafer using optical lithography. Other design rules may come from the mask manufacturing process or, if a character projection charged particle beam writing system is used to form the pattern on a reticle, from the stencil manufacturing process. It should also be noted that the accuracy requirement of the SRAF features on the mask may be lower than the accuracy requirements for the main features on the mask.

There are a number of technologies used for forming patterns on a reticle, including using optical lithography or charged particle beam lithography. The most commonly used system is the variable shaped beam (VSB), where, as described above, doses of electrons with simple shapes such as manhattan rectangles and 45-degree right triangles expose a resist-coated reticle surface. In conventional mask writing, the doses or shots of electrons are conventionally designed to avoid overlap wherever possible, so as to greatly simplify calculation of how the resist on the reticle will register the pattern. Similarly, the set of shots is designed so as to completely cover the pattern area that is to be formed on the reticle.

Reticle writing for the most advanced technology nodes typically involves multiple passes of charged particle beam writing, a process called multi-pass exposure, whereby the given shape on the reticle is written and overwritten. Typically, two to four passes are used to write a reticle to average out precision errors in the charged particle beam writer, allowing the creation of more accurate photomasks. Also typically, the list of shots, including the dosages, is the same for every pass. In one variation of multi-pass exposure, the lists of shots may vary among exposure passes, but the union of the shots in any exposure pass covers the same area. Multi-pass writing can reduce over-heating of the resist coating the surface. Multi-pass writing also averages out random errors of the charged particle beam writer. Multi-pass writing using different shot lists for different exposure passes can also reduce the effects of certain systemic errors in the writing process.

In EUV lithography, OPC features are generally not required. Therefore, the complexity of the pattern to be manufactured on the reticle is less than with conventional 193 nm wavelength optical lithography, and shot count reduction is correspondingly less important. In EUV, however, mask accuracy requirements are very high because the patterns on the mask, which are typically 4× the size of the patterns on the wafer, are sufficiently small that they are challenging to form precisely using charged particle beam technology such as E-beam.

There are numerous undesirable short-range and long-range effects associated with charged particle beam exposure. These effects can cause dimensional inaccuracies in the pattern transferred to a surface such as a reticle. These effects can also increase the dimensional changes that normal process variations cause in the transferred pattern. It would be desirable both to increase the accuracy of the transferred pattern, and also to reduce the dimensional changes associated with process variations.

SUMMARY OF THE DISCLOSURE

In some embodiments, a method for fracturing or mask data preparation includes inputting an original set of shots for a multi-beam charged particle beam writer, where each multi-beam shot in the original set of shots comprises at least one beamlet; and dosages for the original set of shots have not been corrected for long-range effects. An edge slope of a pattern produced on a surface by the original set of shots is calculated. An edge of the pattern which has an edge slope below a target level is identified. For the edge that has the edge slope below the target level, the dosage of a beamlet in a shot in the set of shots is increased to improve the edge slope, where the improved edge slope remains less than the target level.

In some embodiments, a method for fracturing or mask data preparation or proximity effect correction includes inputting an original set of shots for a multi-beam charged particle beam writer, where each multi-beam shot in the original set of shots comprises at least one beamlet. An edge slope of a pattern produced on a surface by the original set of shots is calculated, including correction for long-range effects. An edge in the pattern is identified that has an edge slope below a target level. For the edge that has the edge slope below the target level, the dosage of a beamlet in a shot in the set of shots is increased to improve the edge slope, where the improved edge slope remains less than the target level.

In some embodiments, a method for fracturing or mask data preparation or proximity effect correction includes determining a plurality of shots for a multi-beam charged particle beam writer, where each shot in the plurality of shots comprises at least one beamlet. The plurality of shots forms a pattern on a resist-coated surface, where the step of determining includes calculating an edge slope of the pattern formed from the plurality of shots before correction for long-range effects. An edge of the pattern which has an edge slope below a target level is identified. For the edge that has the edge slope below the target level, the dosage of a beamlet in a shot in the plurality of shots is increased to improve the edge slope.

In some embodiments, a method for fracturing or mask data preparation or proximity effect correction includes determining a plurality of shots for a multi-beam charged particle beam writer, where each shot in the plurality of shots comprises at least one beamlet. The plurality of shots forms a pattern on a resist-coated surface. Proximity effect correction (PEC) is performed to correct shot dosages for long-range effects for the plurality of shots. An edge slope of the pattern formed from the plurality of shots is calculated. An edge of the pattern which has an edge slope below a target level is identified. For the edge that has the edge slope below the target level, the dosage of a beamlet in a shot in the plurality of shots is increased to improve the edge slope.

BRIEF DESCRIPTION OF THE DRAWINGS

FIG. 5A illustrates an example of a single charged particle beam shot and a cross-sectional dosage graph of the shot;

FIG. 5B illustrates an example of a pair of proximate shots and a cross-sectional dosage graph of the shot pair;

FIG. 5C illustrates an example of a pattern formed on a resist-coated surface from the pair of FIG. 5B shots;

FIG. 7A illustrates an example of a shot outline from a rectangular shot;

FIG. 7B illustrates an example of a longitudinal dosage curve for the shot of FIG. 7A using a normal shot dosage;

FIG. 7C illustrates an example of a longitudinal dosage curve similar to FIG. 7B, with long-range effects included;

FIG. 7D illustrates an example of a longitudinal dosage curve for the shot of FIG. 7A using a higher than normal shot dosage;

FIG. 7E illustrates an example of a longitudinal dosage curve similar to FIG. 7D, with long-range effects included;

FIG. 7F illustrates an example of a longitudinal dosage curve similar to FIG. 7E, but with a higher background dosage level;

FIG. 12A illustrates a square pattern to be formed on a surface;

FIG. 12B illustrates a single-shot method of forming the pattern of FIG. 12A on a surface;

FIG. 12C illustrates an example of a method of forming the pattern of FIG. 12A on a surface by one embodiment of the current disclosure;

FIG. 12D illustrates an example of a method of forming the pattern of FIG. 12A on a surface by another embodiment of the current disclosure.

DETAILED DESCRIPTION OF THE EMBODIMENTS

The present disclosure describes a method for fracturing patterns into shots for a charged particle beam writer, where overlapping shots are generated to improve the accuracy and/or the edge slope of the pattern written to a surface. The use of overlapping shots in this application typically increases shot count and exposure time.

Figure 1:
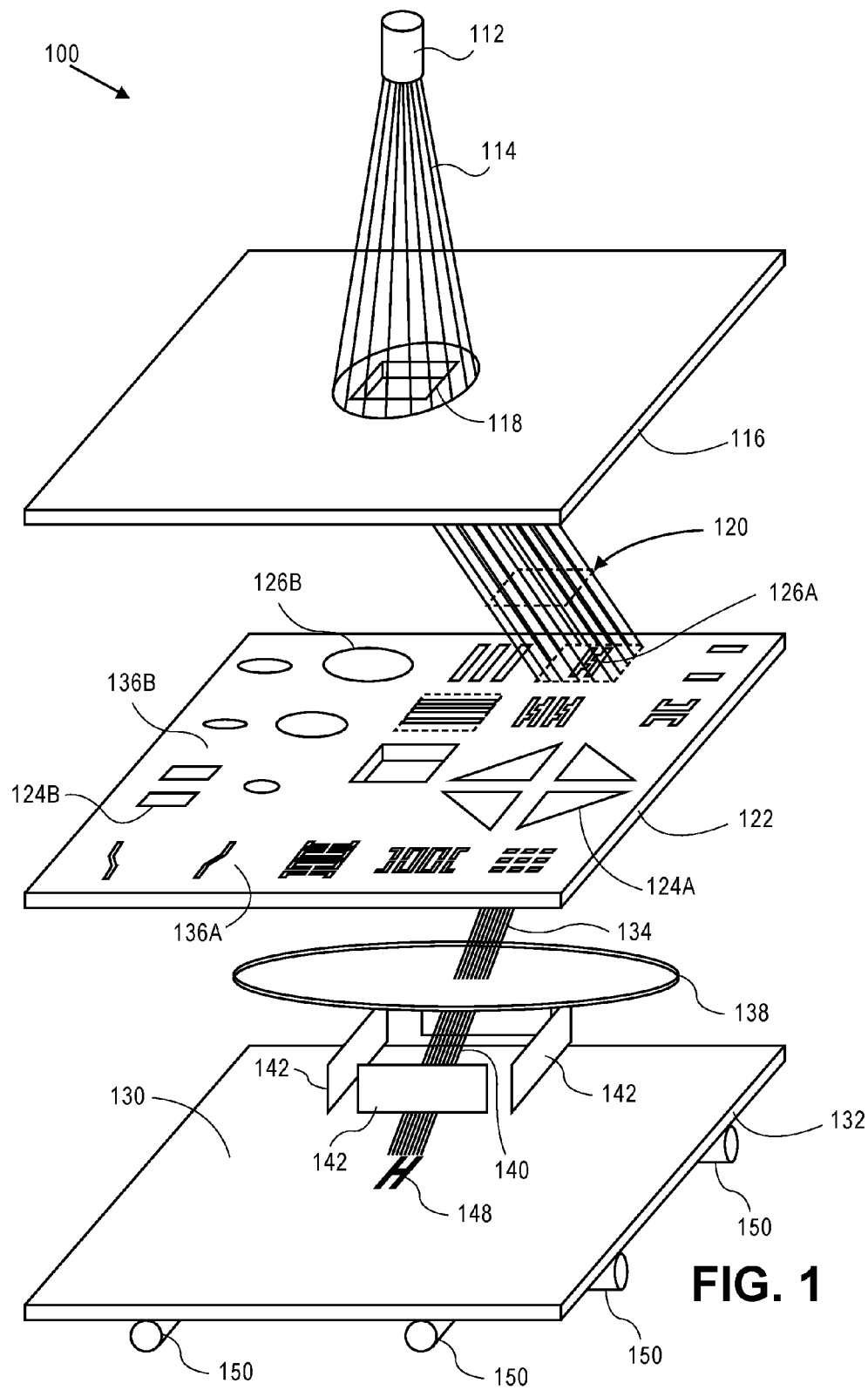
FIG. 1 illustrates an example of a character projection charged particle beam system.

Referring now to the drawings, wherein like numbers refer to like items, FIG. 1 illustrates an embodiment of a conventional lithography system 100, such as a charged particle beam writer system, in this case an electron beam writer system, that employs character projection to manufacture a surface 130. The electron beam writer system 100 has an electron beam source 112 that projects an electron beam 114 toward an aperture plate 116. The plate 116 has an aperture 118 formed therein which allows the electron beam 114 to pass. Once the electron beam 114 passes through the aperture 118 it is directed or deflected by a system of lenses (not shown) as electron beam 120 toward another rectangular aperture plate or stencil mask 122. The stencil 122 has formed therein a number of openings or apertures 124 that define various types of characters 126, which may be complex characters. Each character 126 formed in the stencil 122 may be used to form a pattern 148 on a surface 130 of a substrate 132, such as a silicon wafer, a reticle or other substrate. In partial exposure, partial projection, partial character projection, or variable character projection, electron beam 120 may be positioned so as to strike or illuminate only a portion of one of the characters 126, thereby forming a pattern 148 that is a subset of character 126. For each character 126 that is smaller than the size of the electron beam 120 defined by aperture 118, a blanking area 136, containing no aperture, is designed to be adjacent to the character 126, so as to prevent the electron beam 120 from illuminating an unwanted character on stencil 122. An electron beam 134 emerges from one of the characters 126 and passes through an electromagnetic or electrostatic reduction lens 138 which reduces the size of the pattern from the character 126. In commonly available charged particle beam writer systems, the reduction factor is between 10 and 60. The reduced electron beam 140 emerges from the reduction lens 138, and is directed by a series of deflectors 142 onto the surface 130 as the pattern 148, which is depicted as being in the shape of the letter "H" corresponding to character 126A. The pattern 148 is reduced in size compared to the character 126A because of the reduction lens 138. The pattern 148 is drawn by using one shot of the electron beam system 100. This reduces the overall writing time to complete the pattern 148 as compared to using a variable shape beam (VSB) projection system or method. Although one aperture 118 is shown being formed in the plate 116, it is possible that there may be more than one aperture in the plate 116. Although two plates 116 and 122 are shown in this example, there may be only one plate or more than two plates, each plate comprising one or more apertures.

In conventional charged particle beam writer systems the reduction lens 138 is calibrated to provide a fixed reduction factor. The reduction lens 138 and/or the deflectors 142 also focus the beam on the plane of the surface 130. The size of the surface 130 may be significantly larger than the maximum beam deflection capability of the deflection plates 142. Because of this, patterns are normally written on the surface in a series of stripes. Each stripe contains a plurality of sub-fields, where a sub-field is within the beam deflection capability of the deflection plates 142. The electron beam writer system 100 contains a positioning mechanism 150 to allow positioning the substrate 132 for each of the stripes and sub-fields. In one variation of the conventional charged particle beam writer system, the substrate 132 is held stationary while a sub-field is exposed, after which the positioning mechanism 150 moves the substrate 132 to the next sub-field position. In another variation of the conventional charged particle beam writer system, the substrate 132 moves continuously during the writing process. In this variation involving continuous movement, in addition to deflection plates 142, there may be another set of deflection plates (not shown) to move the beam at the same speed and direction as the substrate 132 is moved.

The minimum size pattern that can be projected with reasonable accuracy onto a surface 130 is limited by a variety of short-range physical effects associated with the electron beam writer system 100 and with the surface 130, which normally comprises a resist coating on the substrate 132. These effects include forward scattering, Coulomb effect, and resist diffusion. Beam blur is a term used to include all of these short-range effects. The most modern electron beam writer systems can achieve an effective beam blur in the range of 20 nm to 30 nm. Forward scattering may constitute one quarter to one half of the total beam blur. Modern electron beam writer systems contain numerous mechanisms to reduce each of the constituent pieces of beam blur to a minimum. Some electron beam writer systems may allow the beam blur to be varied during the writing process, from the minimum value available on an electron beam writing system to one or more larger values.

The shot dosage of a charged particle beam writer such as an electron beam writer system is a function of the intensity of the beam source 112 and the exposure time for each shot. Typically the beam intensity remains fixed, and the exposure time is varied to obtain variable shot dosages. The exposure time may be varied to compensate for various long-range effects such as backscatter and fogging in a process called proximity effect correction (PEC). Electron beam writer systems usually allow setting an overall dosage, called a base dosage, that affects all shots in an exposure pass. Some electron beam writer systems perform dosage compensation calculations within the electron beam writer system itself, and do not allow the dosage of each shot to be assigned individually as part of the input shot list, the input shots therefore having unassigned shot dosages. In such electron beam writer systems all shots have the base dosage, before proximity effect correction. Other electron beam writer systems do allow dosage assignment on a shot-by-shot basis. In electron beam writer systems that allow shot-by-shot dosage assignment, the number of available dosage levels may be 64 to 4096 or more, or there may be a relatively few available dosage levels, such as 3 to 8 levels. Some embodiments of the current invention are targeted for use with charged particle beam writing systems which either do not allow dosage assignment on a shot-by-shot basis, or which allow assignment of one of a relatively few dosage levels.

Figure 2:
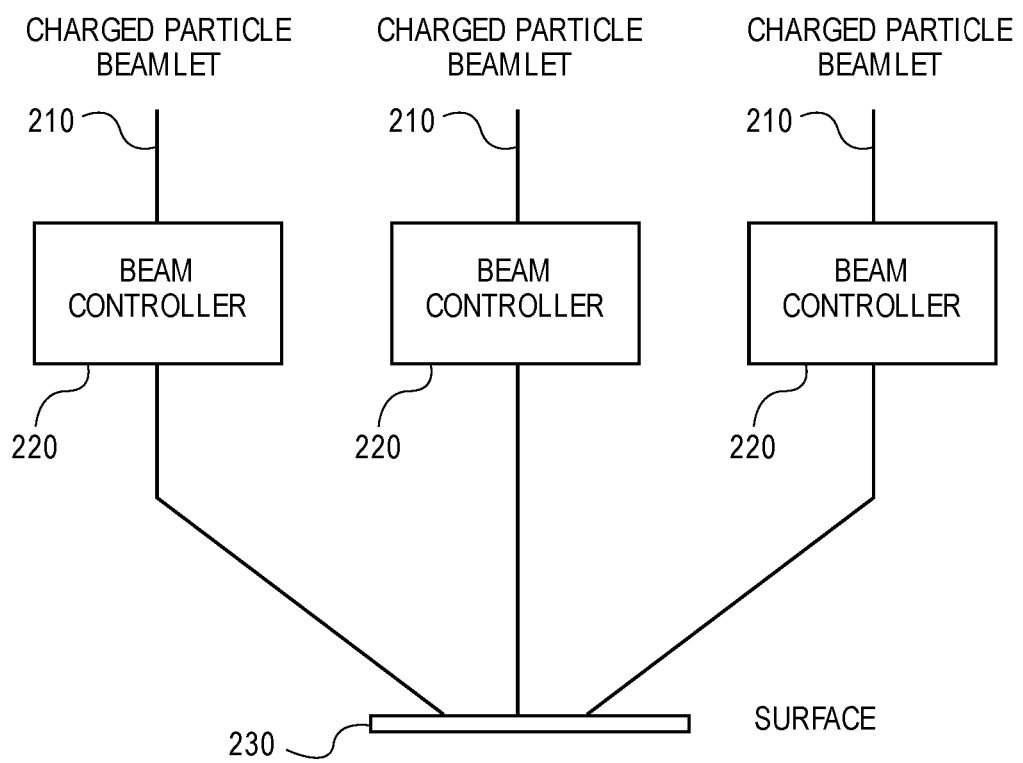
FIG. 2 illustrates an example of an electro-optical schematic diagram of a multi-beam exposure system.

A charged particle beam system may expose a surface with a plurality of individually-controllable beams or beamlets. FIG. 2 illustrates an electro-optical schematic diagram in which there are three charged particle beamlets 210. Associated with each beamlet 210 is a beam controller 220. Each beam controller 220 can, for example, allow its associated beamlet 210 to strike surface 230, and can also prevent beamlet 210 from striking the surface 230. In some embodiments, beam controller 220 may also control beam blur, magnification, size and/or shape of beamlet 210. In this disclosure, a charged particle beam system which has a plurality of individually-controllable beamlets is called a multi-beam system. In some embodiments, charged particles from a single source may be sub-divided to form a plurality of beamlets 210. In other embodiments a plurality of sources may be used to create the plurality of beamlets 210. In some embodiments, beamlets 210 may be shaped by one or more apertures, whereas in other embodiments there may be no apertures to shape the beamlets. Each beam controller 220 may allow the period of exposure of its associated beamlet to be controlled individually. Generally the beamlets will be reduced in size by one or more lenses (not shown) before striking the surface 230, which will typically be coated with a resist. In some embodiments each beamlet may have a separate electro-optical lens, while in other embodiments a plurality of beamlets, including possibly all beamlets, will share an electro-optical lens.

Figure 3A:
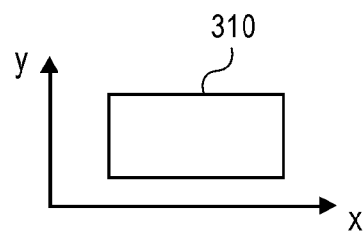
FIG. 3A illustrates an example of a rectangular shot.
Figure 3B:
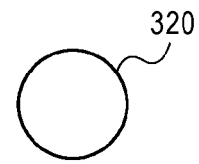
FIG. 3B illustrates an example of a circular character projection shot.
Figure 3C:
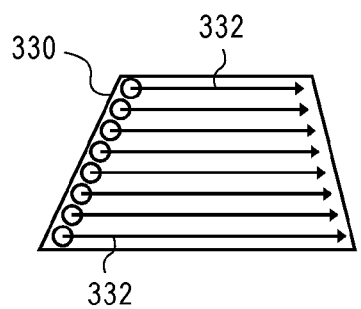
FIG. 3C illustrates an example of a trapezoidal shot.
Figure 3D:
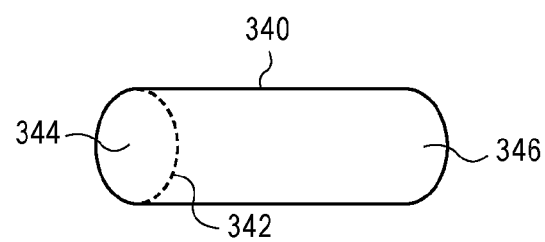
FIG. 3D illustrates an example of a dragged shot.

For purposes of this disclosure, a shot is the exposure of some surface area over a period of time. The area may be comprised of multiple discontinuous smaller areas. A shot may be comprised of a plurality of other shots which may or may not overlap, and which may or may not be exposed simultaneously. A shot may comprise a specified dose, or the dose may be unspecified. Shots may use a shaped beam, an unshaped beam, or a combination of shaped and unshaped beams. FIG. 3 illustrates some various types of shots. FIG. 3A illustrates an example of a rectangular shot 310. A VSB charged particle beam system can, for example, form rectangular shots in a variety of x and y dimensions. FIG. 3B illustrates an example of a character projection (CP) shot 320, which is circular in this example. FIG. 3C illustrates an example of a trapezoidal shot 330. In one embodiment, shot 330 may be a created using a raster-scanned charged particle beam, where the beam is scanned, for example, in the x-direction as illustrated with scan lines 332. FIG. 3D illustrates an example of a dragged shot 340, disclosed in U.S. Patent Application Publication 2011-0089345. Shot 340 is formed by exposing the surface with a curvilinear shaped beam 342 at an initial reference position 344, and then moving the shaped beam across the surface from position 344 to position 346. A dragged shot path may be, for example, linear, piecewise linear, or curvilinear.

Figure 3E:
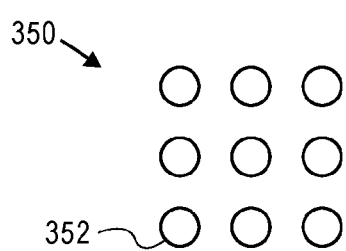
FIG. 3E illustrates an example of a shot which is an array of circular patterns.
Figure 3F:
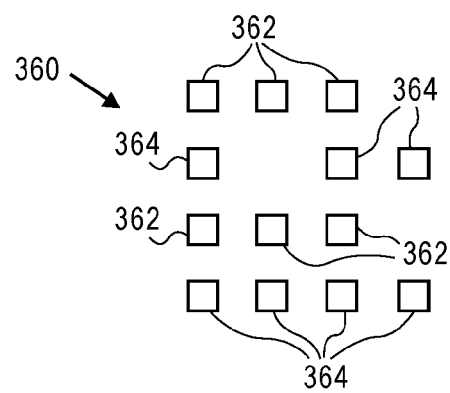
FIG. 3F illustrates an example of a shot which is a sparse array of rectangular patterns.

FIG. 3E illustrates an example of a shot 350 that is an array of circular patterns 352. Shot 350 may be formed in a variety of ways, including multiple shots of a single circular CP character, one or more shots of a CP character which is an array of circular apertures, and one or more multi-beam shots using circular apertures. FIG. 3F illustrates an example of a shot 360 that is a sparse array of rectangular patterns 362 and 364. Shot 360 may be formed in a variety of ways, including a plurality of VSB shots, a CP shot, and one or more multi-beam shots using rectangular apertures. In some embodiments of multi-beam, shot 360 may comprise a plurality of interleaved groups of other multi-beam shots. For example, patterns 362 may be shot simultaneously, then patterns 364 may be shot simultaneously at a time different from patterns 362.

Figure 4:
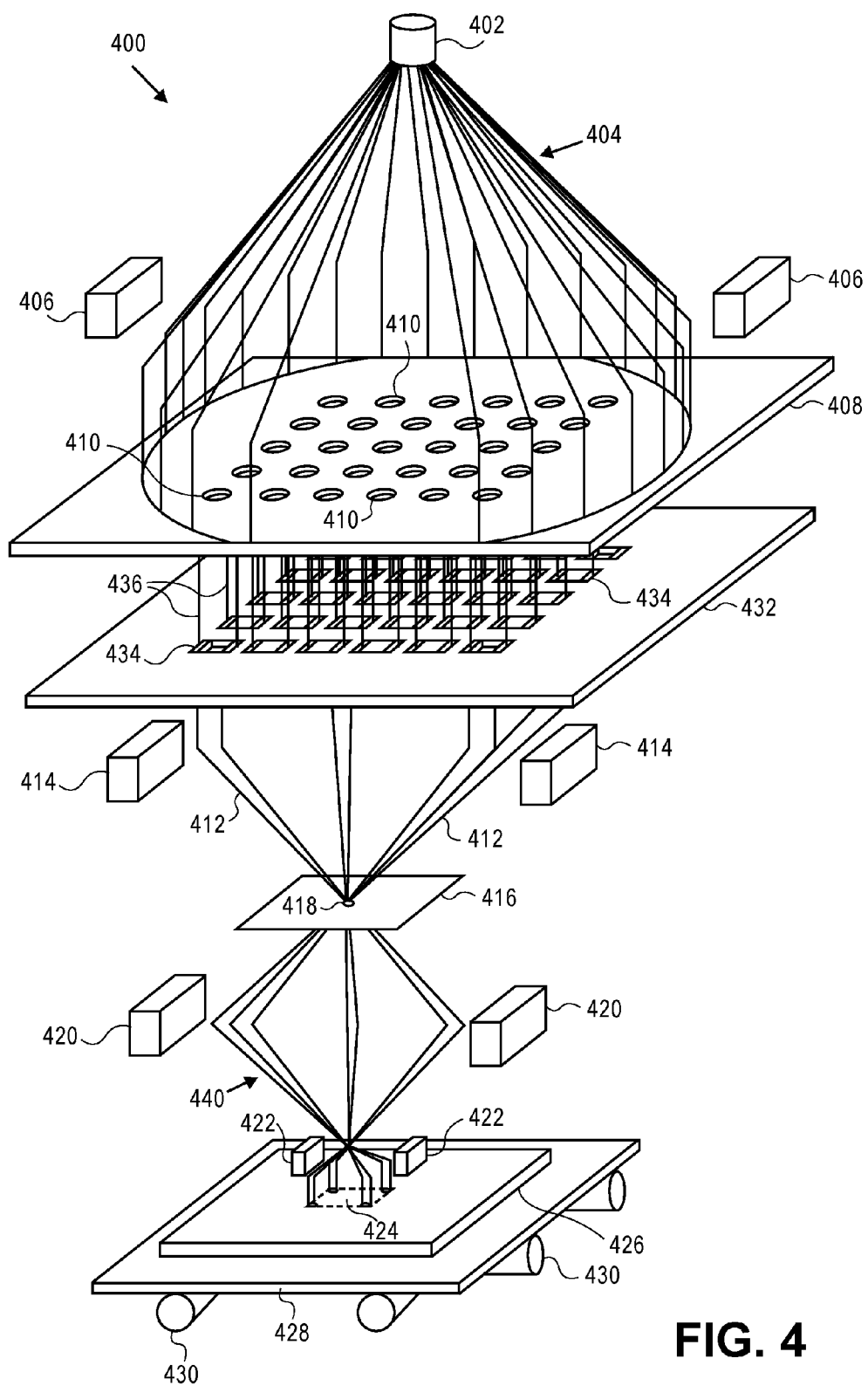
FIG. 4 illustrates an example of a multi-beam charged particle beam system.

FIG. 4 illustrates an embodiment of a charged particle beam exposure system 400. Charged particle beam system 400 is a multi-beam system, in which a plurality of individually-controllable shaped beams can simultaneously expose a surface. Multi-beam system 400 has an electron beam source 402 that creates an electron beam 404. The electron beam 404 is directed toward aperture plate 408 by condenser 406, which may include electrostatic and/or magnetic elements. Aperture plate 408 has a plurality of apertures 410 which are illuminated by electron beam 404, and through which electron beam 404 passes to form a plurality of shaped beamlets 436. Thus, the multi-beam charged particle beam system 400 comprises the charged particle beam source 402 and aperture plate 408, where the aperture plate 408 comprises a plurality of apertures 410 which the charged particle beam 402 source illuminates. In some embodiments, the multi-beam charged particle beam system comprises a single aperture plate 410. In some embodiments, aperture plate 408 may have hundreds or thousands of apertures 410. Although FIG. 4 illustrates an embodiment with a single electron beam source 402, in other embodiments apertures 410 may be illuminated by electrons from a plurality of electron beam sources. Apertures 410 may be rectangular, as shown in FIG. 4, or may be of a different shape, for example circular. The set of beamlets 436 then illuminates a blanking controller plate 432. The blanking controller plate 432 has a plurality of blanking controllers 434, each of which is aligned with a beamlet 436. Each blanking controller 434 can individually control its associated beamlet 436, so as to either allow the beamlet 436 to strike surface 424, or to prevent the beamlet 436 from striking the surface 424. The amount of time for which the beam strikes the surface controls the total energy or "dose" applied by that beamlet. Therefore, the dose of each beamlet may be independently controlled.

In FIG. 4 beamlets that are allowed to strike surface 424 are illustrated as beamlets 412. In one embodiment, the blanking controller 434 prevents its beamlet 436 from striking the surface 424 by deflecting beamlet 436 so that it is stopped by an aperture plate 416 which contains an aperture 418. In some embodiments, blanking plate 432 may be directly adjacent to aperture plate 408. In other embodiments, the relative locations of aperture plate 408 and blanking controller 432 may be reversed from the position illustrated in FIG. 4, so that beam 404 strikes the plurality of blanking controllers 434. A system of lenses comprising elements 414, 420, and 422 allows projection of the plurality of beamlets 412 onto surface 424 of substrate 426, typically at a reduced size compared to the plurality of apertures 410. The reduced-size beamlets form a beamlet group 440 which strikes the surface 424 to form a pattern that matches a pattern of a subset of apertures 410, the subset being those apertures 410 for which corresponding blanking controllers 434 allow beamlets 436 to strike surface 424. In FIG. 4, beamlet group 440 has four beamlets illustrated for forming a pattern on surface 424.

Substrate 426 is positioned on movable platform or stage 428, which can be repositioned using actuators 430. By moving stage 428, beam 440 can expose an area larger than the dimensions of the maximum size pattern formed by beamlet group 440, using a plurality of exposures or shots. In some embodiments, the stage 428 remains stationary during an exposure, and is then repositioned for a subsequent exposure. In other embodiments, stage 428 moves continuously and at a variable velocity. In yet other embodiments, stage 428 moves continuously but at a constant velocity, which can increase the accuracy of the stage positioning. For those embodiments in which stage 428 moves continuously, a set of deflectors (not shown) may be used to move the beam to match the direction and velocity of stage 428, allowing the beamlet group 440 to remain stationary with respect to surface 424 during an exposure. In still other embodiments of multi-beam systems, individual beamlets in a beamlet group may be deflected across surface 424 independently from other beamlets in the beamlet group.

Other types of multi-beam systems may create a plurality of unshaped beamlets 436, such as by using a plurality of charged particle beam sources to create an array of Gaussian beamlets.

FIGS. 5A-B illustrate how energy is registered on a resist-coated surface from one or more charged particle beam shots. In FIG. 5A rectangular pattern 502 illustrates a shot outline, which is a pattern that will be produced on a resist-coated surface from a shot which is not proximate to other shots. The corners of pattern 502 are rounded due to beam blur. In dosage graph 510, dosage curve 512 illustrates the cross-sectional dosage along a line 504 through shot outline 502. Line 514 denotes the resist threshold, which is the dosage above which the resist will register a pattern. As can be seen from dosage graph 510, dosage curve 512 is above the resist threshold between the X-coordinates "a" and "b". Coordinate "a" corresponds to dashed line 516, which denotes the left-most extent of the shot outline 502. Similarly, coordinate "b" corresponds to dashed line 518, which denotes the right-most extent of the shot outline 502. The shot dosage for the shot in the example of FIG. 5A is a normal dosage, as marked on dosage graph 510. In conventional mask writing methodology, the normal dosage is set so that a relatively large rectangular shot will register a pattern of the desired size on the resist-coated surface, in the absence of long-range effects. The normal dosage therefore depends on the value of the resist threshold 514.

FIG. 5B illustrates the shot outlines of two particle beam shots, and the corresponding dosage curve. Shot outline 522 and shot outline 524 result from two proximate particle beam shots. In dosage graph 520, dosage curve 530 illustrates the dosage along the line 526 through shot outlines 522 and 524. As shown in dosage curve 530, the dosage registered by the resist along line 526 is the combination, such as the sum, of the dosages from two particle beam shots, represented by shot outline 522 and shot outline 524. As can be seen, dosage curve 530 is above the threshold 514 from X-coordinate "a" to X-coordinate "d". This indicates that the resist will register the two shots as a single shape, extending from coordinate "a" to coordinate "d". FIG. 5C illustrates a pattern 552 that the two shots from the example of FIG. 5B may form. The variable width of pattern 552 is the result of the gap between shot outline 522 and shot outline 524, and illustrates that a gap between the shots 522 and 524 causes dosage to drop below threshold near the corners of the shot outlines closest to the gap.

When using conventional non-overlapping shots using a single exposure pass, conventionally all shots are assigned a normal dosage before PEC dosage adjustment. A charged particle beam writer which does not support shot-by-shot dosage assignment can therefore be used by setting the base dosage to a normal dosage. If multiple exposure passes are used with such a charged particle beam writer, the base dosage is conventionally set according to the following equation:

base dosage=normal dosage/# of exposure passes

Figure 6A:
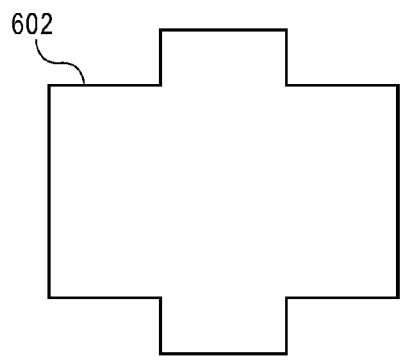
FIG. 6A illustrates an example of a polygonal pattern.
Figure 6B:
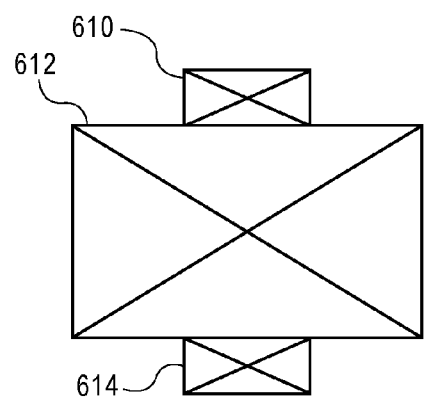
FIG. 6B illustrates an example of a conventional fracturing of the polygonal pattern of FIG. 6A.
Figure 6C:
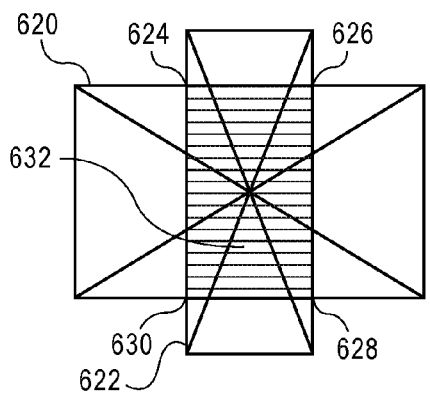
FIG. 6C illustrates an example of an alternate fracturing of the polygonal pattern of FIG. 6A.

FIGS. 6A-C illustrate two known methods of fracturing a polygonal pattern. FIG. 6A illustrates a polygonal pattern 602 that is desired to be formed on a surface. FIG. 6B illustrates a conventional method of forming this pattern using non-overlapping or disjoint shots. Shot outline 610, shot outline 612 and shot outline 614, which are marked with X's for clarity, are mutually disjoint. Additionally, the three shots associated with these shot outlines all use a desired normal dosage, before proximity effect correction. An advantage of using the conventional method as shown in FIG. 6B is that the response of the resist can be easily predicted. Also, the shots of FIG. 6B can be exposed using a charged particle beam system which does not allow dosage assignment on a shot-by-shot basis, by setting the base dosage of the charged particle beam writer to the normal dosage. FIG. 6C illustrates an alternate method of forming the pattern 602 on a resist-coated surface using overlapping shots, disclosed in U.S. patent application Ser. No. 12/473,265, filed May 27, 2009 and entitled "Method And System For Design Of A Reticle To Be Manufactured Using Variable Shaped Beam Lithography." In FIG. 6C the constraint that shot outlines cannot overlap has been eliminated, and shot 620 and shot 622 do overlap. In the example of FIG. 6C, allowing shot outlines to overlap enables forming the pattern 602 in only two shots, compared to the three shots of FIG. 6B. In FIG. 6C, however the response of the resist to the overlapping shots is not as easily predicted as in FIG. 6B. In particular, the interior corners 624, 626, 628 and 630 may register as excessively rounded because of the large dosage received by overlapping region 632, shown by horizontal line shading. Charged particle beam simulation may be used to determine the pattern registered by the resist. In one embodiment, charged particle beam simulation may be used to calculate the dosage for each grid location in a two-dimensional (X and Y) grid, creating a grid of calculated dosages called a dosage map. The results of charged particle beam simulation may indicate use of non-normal dosages for shot 620 and shot 622. Additionally, in FIG. 6C the overlapping of shots in area 632 increases the area dosage beyond what it would be without shot overlap. While the overlap of two individual shots will not increase the area dosage significantly, this technique will increase area dosages and total dosage if used throughout a design.

In exposing, for example, a repeated pattern on a surface using charged particle beam lithography, the size of each pattern instance, as measured on the final manufactured surface, will be slightly different, due to manufacturing variations. The amount of the size variation is an essential manufacturing optimization criterion. In mask masking today, a root mean square (RMS) variation of no more than 1 nm (1 sigma) may be desired. More size variation translates to more variation in circuit performance, leading to higher design margins being required, making it increasingly difficult to design faster, lower-power integrated circuits. This variation is referred to as critical dimension (CD) variation. A low CD variation is desirable, and indicates that manufacturing variations will produce relatively small size variations on the final manufactured surface. In the smaller scale, the effects of a high CD variation may be observed as line edge roughness (LER). LER is caused by each part of a line edge being slightly differently manufactured, leading to some waviness in a line that is intended to have a straight edge. CD variation is inversely related to the slope of the dosage curve at the resist threshold, which is called edge slope. Therefore, edge slope, or dose margin, is a critical optimization factor for particle beam writing of surfaces.

Edge slope, also referred to as dose margin, is generally known to be related to resilience to manufacturing variation. Critical dimension uniformity (CDU), line edge roughness (LER) and line width roughness (LWR) are commonly used measures of manufacturing variation. As an example, if the desired shape on a photomask is a set of long straight lines, say of 50 nm width and 100 µm long running parallel to the Y-axis of the photomask, CDU is the statistical variation seen when measuring the width of the line at multiple locations. LER is the statistical variation in the location (the X location in this case) of one of the edges in some length, such as 2 µm, of a line; and LWR is the statistical variation in the width of a line along some length, such as 2 µm, of a line.

A better edge slope is generally believed to improve CDU, LER, and LWR, if all other conditions are equal. Since improved resilience to manufacturing variation is desirable, various prior art contains the notion of improving edge slope. However, the present disclosure recognizes that attempts to improve edge slope by increasing dose creates other conditions that make manufacturing variation worse. The other conditions that are affected by increasing dose are not equal because the very action that attempts to improve edge slope alters other conditions. In addition, specifically in the case of increasing dose in an attempt to improve edge slope, it is critical to consider the effects of proximity effect correction (PEC). While increasing the dose of one figure (say just one of the lines described above) improves edge slope, increasing the dose of all lines (say all the lines in the example above) increases the background dose created by backscatter of the electrons that scatter in a 10-30 µm range for a photomask. Since this effect contributes significantly to CDU across varying density of the surrounding areas, PEC is applied by the particle beam writers such as mask writers. PEC mathematically reduces dose of each exposure by just the right amount to make the CD equal to what the CD would have been without backscatter. PEC therefore effectively makes the effect of backscatter disappear. But backscatter is always a positive value, and therefore PEC always reduces dose to compensate. This means that if dose everywhere is increased in an attempt to improve edge slope for every edge to the best slope that is realistically possible (for example, limited by the electron beam writer's limit for maximum dose, or by practical consideration for write time), backscatter dose will increase and therefore PEC will make edge slope worse for some of the features that are within backscatter range of a collection of areas where dose was increased.

Further, optimizing edge slope by increasing dose is flawed, even if there was no backscatter or PEC. For an effect approximated by a Gaussian distribution, such as with particle beam exposure of resists as practiced for exposure, bake, and development of photomasks, wafers, flat panel displays, and the like, edge slope at a resist threshold is theoretically always better by increasing dose. An infinite dose has the optimal edge slope. Of course, there are many other limiting factors for a maximum dose, such as write time, thermal effects, and predictable resist behavior. So machines typically have a maximum dose that can be applied to a given area at any given time, such as 2× or 3× nominal dose. The conventional teaching of optimizing edge slope would always choose the maximum allowed dose.

It has also been taught in the art to increase dose only around the edges of shapes that are being exposed so that edge slope is improved on the edges without increasing dose in the interior areas of the shapes. This decreases the degree to which overall dose is increased, and therefore reduces the amount of PEC applied to all surrounding shapes. As semiconductor devices have continued to advance, however, the shapes being exposed generally have narrow widths. For photomasks, minimum widths may be, for example, 40 nm. For wafer direct write and for nanoimprint masters, minimum widths may be, for example, 15 nm. Since such cases are then affected significantly by shapes that have no interior areas, it is no longer sufficient to use maximum allowed dose on all edges.

The present disclosure addresses the limitations of conventional methods through the use of an edge slope that is meets a target level; that is, an edge slope that is "good enough." Since resilience to manufacturing variation is a statistical notion, the sense of a "good enough" edge slope is not an exact expression of a strict inequality. In some embodiments of the present methods, shots and dosages are determined in which edge slopes are below a target level. For example, edge slope is achieved at a level that is the best that can be done given trade-offs with other conditions that affect manufacturing accuracy. In other embodiments, shots and dosages are determined in which the edge slopes are above a "good enough" level. For example, even 1.0× dose would be above good enough for low backscatter regions. Improving edge slope to a less than optimal level—that is, below a target level—is counter-intuitive since the conventional teaching is to maximize edge slope. Furthermore, determining an amount of edge slope that does not meet an optimal level can require additional computation time in order to determine the balance of other manufacturing aspects, and thus is also counter-intuitive.

In some embodiments, the dosage of a beamlet in a set of shots for a multi-beam writer is increased to improve edge slope, where the edge slope with the increased dosage of the beamlet may be below a target level. In some embodiments, a target or "good enough" level may be measured empirically through a test chip that measures CD variation across dose variation in various shapes and sizes. In other embodiments, a target or "good enough" level may be calculated by simulating the edge slope of a feature that is known in the manufacturing process to be working sufficiently well to be used for production purposes. For example, for leading edge photomask manufacturing, a repeating pattern of 100 nm wide wires separated by 100 nm wide spaces may be known to be stable, when exposed with a normal dose. A simulation of the edge slope for a 100 nm wide line in the context of a 100 nm line-and-space pattern may be considered an edge slope that is "good enough." For purposes of calculating PEC correction, such as from backscatter, a 100 nm line-and-space pattern has a 50% exposure density in the surrounding area. Although a 50% exposure density may not be the worst PEC condition—i.e. highest level of backscatter—on a practical design, it may be declared as a good practical target to achieve.

FIG. 7A illustrates an example of an outline of a rectangular shot 702. FIG. 7B illustrates an example of a dosage graph 710 illustrating the dosage along the line 704 through shot outline 702 with a normal shot dosage, with no backscatter, such as would occur if shot 702 was the only shot within the range of backscattering effect, which, as an example, may be 10 microns. Other long-range effects are also assumed to contribute nothing to the background exposure of FIG. 7B, leading to a zero background exposure level. The total dosage delivered to the resist is illustrated on the y-axis, and is 100% of a normal dosage. Because of the zero background exposure, the total dosage and the shot dosage are the same. Dosage graph 710 also illustrates the resist threshold 714. The CD variation of the shape represented by dosage graph 710 in the x-direction is inversely related to the slope of the dosage curve 712 at x-coordinates "a" and "b" where it intersects the resist threshold. The slope of dosage curve 712 at threshold 714 is illustrated as the hypotenuse 716 of a right triangle.

The FIG. 7B condition of zero background exposure is not reflective of actual designs. Actual designs will typically have many other shots within the backscattering distance of shot 702. FIG. 7C illustrates an example of a dosage graph 720 of a shot with a normal dosage with non-zero background exposure 728. In this example, a background exposure of 20% of a normal dosage is shown. In dosage graph 720, dosage curve 722 illustrates the cross-sectional dosage of a shot similar to shot 702. The slope of the dosage curve 722 at threshold 724 is illustrated as the hypotenuse 726 of a right triangle. The CD variation of curve 722 is worse than the CD variation of curve 712, as indicated by the lower edge slope 726 where curve 722 intersects resist threshold 724 at points "a" and "b", compared to edge slope 716. The lower edge slope 726 is due to the background exposure caused by backscatter.

One method of increasing the slope of the dosage curve at the resist threshold is to increase the shot dosage. FIG. 7D illustrates an example of a dosage graph 730 with a dosage curve 732 which illustrates a total dosage of 150% of normal dosage, with no background exposure. With no background exposure, the shot dosage equals the total dosage. Threshold 734 in FIG. 7D is unchanged from threshold 714 in FIG. 7B. Increasing shot dosage increases the size of a pattern registered by the resist. Therefore, to maintain the size of the resist pattern, illustrated as the intersection points of dosage curve 732 with threshold 734, the shot size used for dosage graph 730 is somewhat smaller than shot 702. The slope of the dosage curve 732 at threshold 734 is illustrated as the hypotenuse 736 of a right triangle. As can be seen, the slope 736 of dosage curve 732 is higher where it intersects threshold 734 than is the slope 716 of dosage curve 712 where it intersects threshold 714. This may improve the CD variation for the higher-dosage shot of FIG. 7D, compared to the normal dosage shot of FIG. 7B.

Like dosage graph 710, however, the zero background exposure condition of dosage graph 730 is not reflective of actual designs. FIG. 7E illustrates an example of a dosage graph 740 with the shot dosage adjusted to achieve a total dosage on the resist of 150% of normal dosage with a 20% background exposure, such as would occur if the dosage of only one shot was increased to achieve total dosage of 150% of a normal dosage, and dosage of other shots remained at 100% of normal dosage. The threshold 744 is the same as in FIGS. 7B-7D. The background exposure is illustrated as line 748. The slope of the dosage curve 742 at threshold 744 is illustrated as the hypotenuse 746 of a right triangle. As can be seen, the slope 746 of dosage curve 742 is less than the slope 736 of dosage curve 732 because of the presence of backscatter. Comparing graphs 720 and 740 for the effect of shot dosage, the slope 746 of dosage curve 742 is higher than the slope 726 of dosage curve 722, indicating that improved edge slope can be obtained for a single shot by increasing dosage, if dosages of other shots remain the same.

FIG. 7F illustrates an example of a dosage graph 750, illustrating the case where the dosages of all shots have been increased to 150% of normal dose. Two background dosage levels are shown on dosage graph 750: a 30% background dose 759, such as may be produced if all shots use 150% of normal dosage, and a 20% background dose 758 shown for comparison, since 20% is the background dosage in the dosage graph 740. Dosage curve 752 is based on the 30% background dose 759. The slope of the dosage curve 752 at threshold 754 is illustrated as the hypotenuse 756 of a right triangle. As can be seen, the edge slope 756 of dosage curve 752 is less than the slope 746 of dosage curve 742 at the same points.

In summary, FIGS. 7A-7F illustrate that higher-than-normal dosage can be used selectively to lower CD variation for isolated shapes. However, as indicated above, increasing edge slope may not always produce improved CD variation.

Figure 8A:
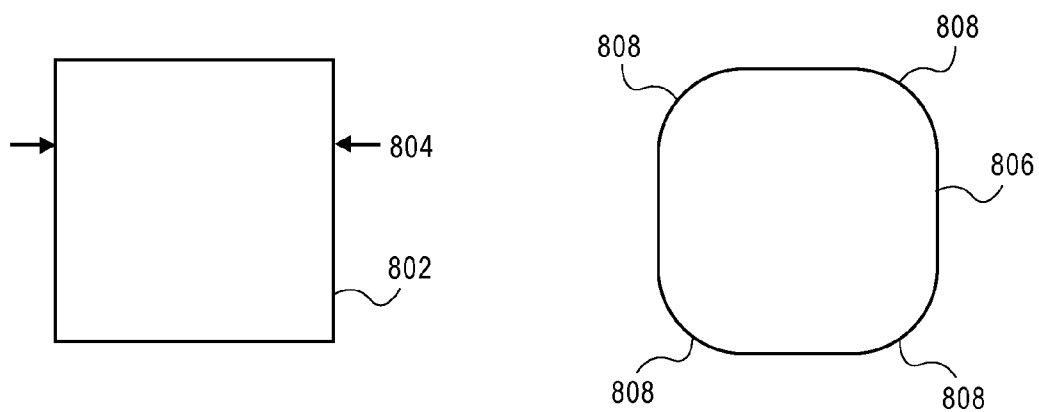
FIG. 8A illustrates an example of how a 100 nm square VSB shot may be registered on a reticle.
Figure 8B:
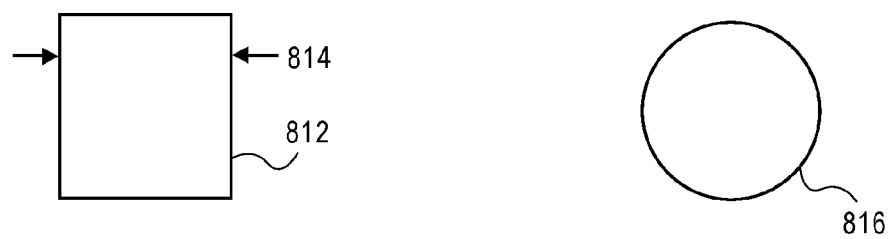
FIG. 8B illustrates an example of how a 60 nm square VSB shot may be registered on a reticle.

FIG. 8A illustrates an example of a square VSB shot 802. In this example square 802 has a dimension 804 of 100 nm. Pattern 806 is an example of how shot 802, with a normal dose, may register on a resist-coated surface. As can be seen, the corners 808 of pattern 806 are rounded, due to beam blur. If formed on a reticle to be used for EUV optical lithography using 4× reduction printing, pattern 806 could be used to form a pattern on a wafer having a size of approximately 25 nm. FIG. 8B illustrates an example of a smaller square VSB shot 812. In this example, the dimension 814 of shot 812 is 60 nm, suitable for manufacturing a 4× reticle for a pattern intended to be 15 nm on a wafer. Pattern 816 is an example of how shot 812 may register on a resist-coated surface. As can be seen, the corner rounding effects of beam blur have caused the registered pattern to be virtually circular. Additionally, though not illustrated, the edge slope of pattern 816 will be lower than that of pattern 806, and may be below a minimum pre-determined level to produce acceptable CD variation. FIGS. 8A&B illustrate how beam blur effects become more significant as pattern dimensions decrease.

As fabrication processes get smaller, short-range beam blur effects become a more significant issue for both direct-write and for reticle/mask fabrication. Small geometries can also have problems with edge slope due to long-range effects. Accurate fabrication of the ends of minimum-width lines—that is the lines having the minimum width permissible in a fabrication process—can become challenging using conventional techniques, as will be shown below. One type of pattern on which these problems may be exhibited is at a line end, which is the region near an end of a path, where the path may be of constant width, such as interconnect lines or where polysilicon crosses and extends beyond diffusion to form a MOS transistor.

Figure 9A:
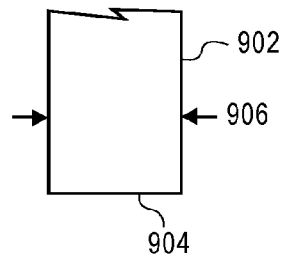
FIG. 9A illustrates an example of a pattern comprising the end portion of a line.
Figure 9B:
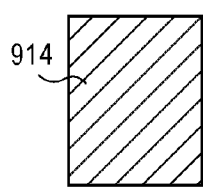
FIG. 9B illustrates an example of a conventional single-shot method of forming the pattern of FIG. 9A on a surface.
Figure 9C:
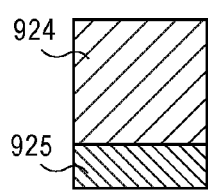
FIG. 9C illustrates an example of a method of forming the pattern of FIG. 9A on a surface by one embodiment of the current disclosure.

FIG. 9A illustrates an example of a portion 902 of a line that is desired to be formed on a reticle. The portion includes line end 904. In this example the designed width on the wafer is 20 nm. Using a 4× mask, the target width 906 on the reticle is therefore 80 nm. FIG. 9B illustrates an example of an outline of a single VSB shot 914 that may be used with normal dosage to conventionally form the pattern on a reticle. FIG. 9B also illustrates a pattern 918 formed on the reticle by the shot 914. As can be seen, the corners of line-end pattern 918 are significantly rounded. A portion 919 of the perimeter of pattern 918 is illustrated with a dashed line, indicating that this portion of the perimeter has an edge slope that is less than a pre-determined minimum. FIG. 9C illustrates an example of a method for forming the pattern 902 according to the current disclosure, such as with a multi-beam charged particle beam writer. In FIG. 9C, two dosage levels are used for multi-beam beamlets. Beamlets in area 924 uses higher-than-normal dosage. Beamlets in area 925 have even higher dosage than those in area 924. The two dosage levels 924 and 925 can produce a pattern 928 on the reticle, where the corners of pattern 928 are less rounded than the corners of pattern 918. The dashed line portions 929 of the perimeter of pattern 928 is shorter than the dashed line portion 919 of pattern 918, indicating improved line end edge slope in pattern 928, due to the higher line-end exposure in pattern 928 compared to pattern 918. The improved edge slope at line end areas 929 of pattern 928 may meet an acceptable target level, or may be below the target level in order to provide acceptable trade-offs for other manufacturing aspects.

Figure 9D:
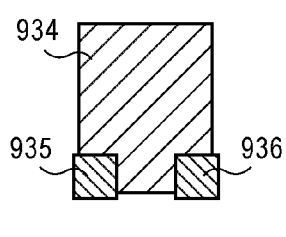
FIG. 9D illustrates an example of a method of forming the pattern of FIG. 9A on a surface by another embodiment of the current disclosure.

FIG. 9D illustrates another embodiment of the current disclosure, using higher dosages at corners of the line end. Beamlets in area 934 uses higher-than-normal dosage, like area 924 of FIG. 9C. Beamlets in areas 935 and shot 936 have even higher dosage than area 934, to provide additional peak dosage near the line end corners. As illustrated in this example, areas 935 and 936 extend beyond the outline of area 934 and of the original pattern 902. The beamlet dosages in areas 934, 935 and 936 can produce a pattern 938 on a reticle, where pattern 938 corners are less rounded than the corners of pattern 928. Additionally, low edge slope portion 939 of the perimeter of pattern 938 is smaller than perimeter portion 929 of pattern 928. FIG. 9D illustrates how more complex dosage areas may be used to form line end patterns which both more accurately achieve the desired shape and which have a higher edge slope. As described previously, the improved edge slope at edges 939 of pattern 939 may be below a target level rather than being maximized, in order to provide acceptable trade-offs for other manufacturing aspects.

Figure 9E:
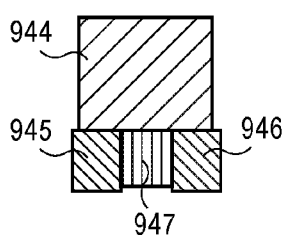
FIG. 9E illustrates an example of a method of forming the pattern of FIG. 9A on a surface by yet another embodiment of the current disclosure.

FIG. 9E illustrates yet another embodiment of the current disclosure, using four dosage areas for multi-beam beamlets to form the line end 904 of pattern 902. In addition to dosage area 944, which may have a higher-than-normal dosage, beamlets in two corner dosage areas 945 and 946 have higher dosage than beamlets in dosage area 944. The dosage of beamlets in the fourth dosage area 947 is higher than beamlets in dosage area 944, but may be less than in areas 945 and 946. Pattern 948 illustrates a pattern that the combination of dosage areas 944, 945, 946 and 947 can produce on a reticle. In pattern 948 the perimeter portion 949 which has a lower-than-minimum edge slope is slightly smaller than FIG. 9D perimeter portion 939. The edge slope of the line end areas 949, which are corners of the line end area of pattern 948 in this embodiment, are improved. The edge slope may be improved to a "good enough."

FIGS. 9C-E illustrate how a set of shots may be modified with varying dosages of beamlets within multi-beam shots to produce small areas of high peak dosage near line ends, improving both the accuracy and the edge slope of the pattern manufactured on a reticle. Exposure of only a small area with a higher-than-normal dosage produces less increase in backscatter than if the higher-than-normal dosage was used for the entire pattern. Particle beam simulation may be used to determine the effect that a set of shots and dosages will produce on the reticle surface.

FIGS. 12A-E illustrate the use of varying dosages with square patterns, such as are commonly used for contact and via patterns in integrated circuit design. FIG. 12A illustrates an example of a desired pattern 1202 to be formed on a reticle. FIG. 12B illustrates a single VSB shot 1212 which may be used to form pattern 1202 conventionally. Multi-beam exposure using equal dosage beamlets is equivalent to the single VSB shot 1212. For small patterns, however, use of single VSB shot 912 may cause corner rounding similar to the corner rounding illustrated in FIG. 9B pattern 918. Also like pattern 918, use of single shot 1212 may cause edge slope to be undesirably low. FIG. 12C illustrates an example of one embodiment of the present disclosure for forming a square or nearly-square pattern. There are five dosage areas are which are exposed by beamlets of a multi-beam writer, the dosage areas including dosage area 1222, which is cross-hatched for identification, and four corner dosage areas 1224. Beamlets in the corner dosage areas 1224 have higher dosage than beamlets in dosage area 1222. As with the FIG. 9D line-end shot configuration, increasing peak dosage near the corners of the pattern may improve the fidelity of the transferred pattern, and may also improve the edge slope near the corners of the transferred pattern, so as to reduce CD variation. As in previous embodiments, the edge slope at the corners 1224 may be improved, but may still be below a target level.

FIG. 12D illustrates an example of another embodiment of the present disclosure. In FIG. 12D outline 1232 corresponds to element 1202 in FIG. 12A. Within the outline 1232, there are three dosage areas which are exposed by beamlets of a multi-beam writer. Beamlets in dosage area 1234 may have a normal or less-than-normal dosage. Beamlets in dosage area 1236 have a higher-than-normal dosage. Beamlets in dosage area 1238 may have: a) a similar dosage to dosage area 1234, b) less dosage than dosage area 1234, or in some embodiments, c) zero dosage. In this example, the high dosage of area 1236 will cause a pattern to get registered larger than the perimeter of area 1236. The dosage needed for area 1238 depends on:

- The width of area 1238
- The dosage of area 1236

The use of higher dosage in area 1236 increases the edge slope at the resist threshold—i.e. at the outline 1232. Use of zero dosage in area 1238 may produce a higher edge slope than if a non-zero dosage is used in area 1238. The use of a smaller dosage in area 1234 than in area 1236 produces a lower area dosage, reducing the backscatter, compared to if the high dosage of area 1236 was also used in area 1234. The resulting improvement in edge slope may still be below a target level, as described in previous embodiments.

The methods of the present disclosure may also be employed with fabrication processes that use rectangular contacts and/or vias. For rectangular patterns with an aspect ratio of about 1:1.5 or less, the method illustrated in FIG. 12D may be used. For rectangular patterns with greater aspect ratios, each end of the longer axes of the rectangular pattern may be treated as a line end.

The solution described above with FIG. 12C may be implemented even using a charged particle beam system that does not allow dosage assignment for individual shots. In one embodiment of the present invention, a small number of dosages may be selected, for example two dosages such as 1.0× normal and 0.6× normal, and shots for each of these two dosages may be separated and exposed in two separate exposures passes, where the base dosage for one exposure pass is 1.0× normal and the base dosage for the other exposure pass is 0.6× normal. In the example of FIG. 12C, dosage area 1222 may be assigned to a first exposure pass which uses a base dosage of 1.0× normal dosage before PEC correction. The dosage areas 1224 may be assigned to a second exposure pass which uses a base dosage of 0.6× normal dosage before PEC correction.

The dosage that would be received by a surface can be calculated and stored as a two-dimensional (X and Y) dosage map called a glyph. A two-dimensional dosage map or glyph is a two-dimensional grid of calculated dosage values for the vicinity of the shots comprising the glyph. This dosage map or glyph can be stored in a library of glyphs. The glyph library can be used as input during fracturing of the patterns in a design. For example, referring again to FIG. 12D, a dosage map may be calculated for the combination of dosage areas 1234, 1236, and 1238, and stored in the glyph library. If during fracturing, one of the input patterns is a square pattern of the same size as pattern 1202, the glyph for pattern 1202 and the beamlet dosages comprising the glyph may be retrieved from the library, avoiding the computational effort of determining an appropriate set of dosages to form the square input pattern. A series of glyphs may also be combined to create a parameterized glyph. Parameters may be discrete or may be continuous. For example, dosage maps for forming square patterns such as square pattern 1202 may be calculated for a plurality of pattern sizes, and the plurality of resulting glyphs may be combined to form a discrete parameterized glyph.

Figure 10:
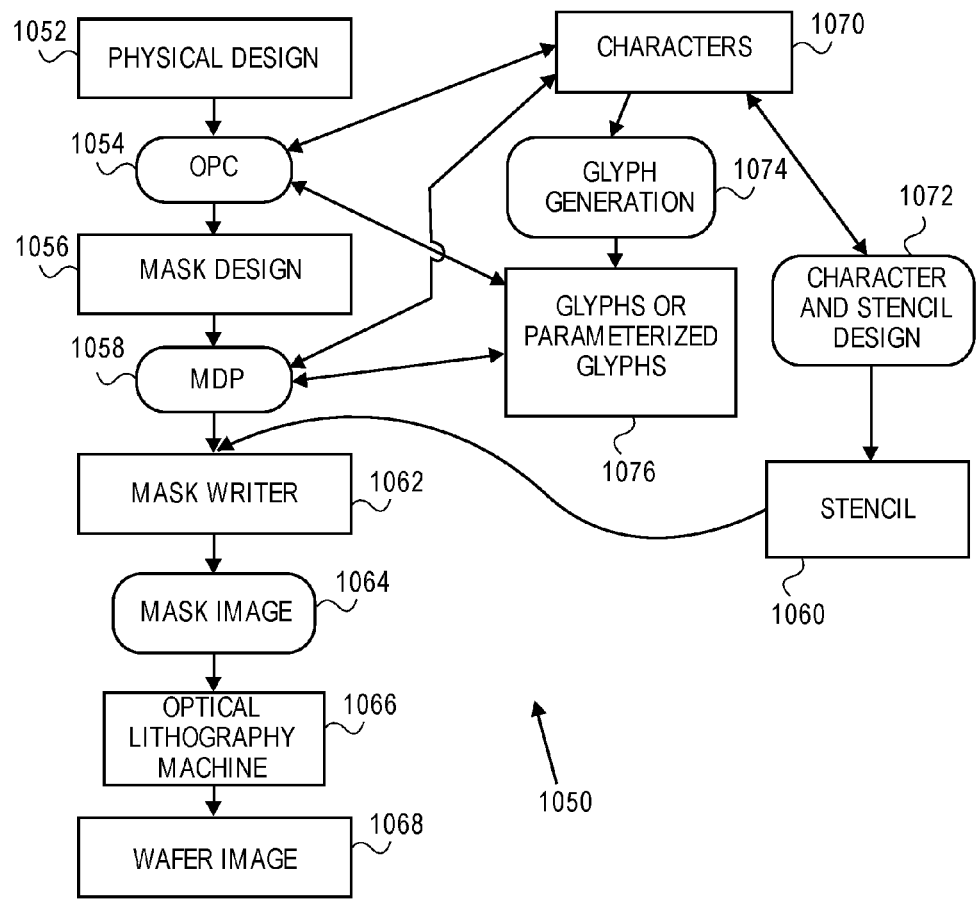
FIG. 10 illustrates a conceptual flow diagram of how to prepare a surface, such as a reticle, for use in fabricating a substrate such as an integrated circuit on a silicon wafer using optical lithography.

FIG. 10 is a conceptual flow diagram 1050 of how to prepare a reticle for use in fabricating a surface such as an integrated circuit on a silicon wafer. In a first step 1052, a physical design, such as a physical design of an integrated circuit, is designed. This can include determining the logic gates, transistors, metal layers, and other items that are required to be found in a physical design such as that in an integrated circuit. Next, in a step 1054, optical proximity correction is determined. In an embodiment of this disclosure this can include taking as input a library of pre-calculated glyphs or parameterized glyphs 1076. This can also alternatively, or in addition, include taking as input a library of pre-designed CP characters 1070 including complex characters that are to be available on a stencil 1060 in a step 1062. In an embodiment of this disclosure, an OPC step 1054 may also include simultaneous optimization of shot count or write times, and may also include a fracturing operation, a shot placement operation, a dose assignment operation, or may also include a shot sequence optimization operation, or other mask data preparation operations, with some or all of these operations being simultaneous or combined in a single step. Once optical proximity correction is completed a mask design is developed in a step 1056.

In a step 1058, a mask data preparation operation which may include a fracturing operation, a shot placement operation, a dose assignment operation, or a shot sequence optimization may take place. Either of the steps of the OPC step 1054 or of the MDP step 1058, or a separate program independent of these two steps 1054 or 1058 can include a program for determining a limited number of stencil characters that need to be present on a stencil or a large number of glyphs or parameterized glyphs that can be shot on the surface with a small number of shots by combining characters that need to be present on a stencil with varying dose, position, and degree of partial exposure to write all or a large part of the required patterns on a reticle. Combining OPC and any or all of the various operations of mask data preparation in one step is contemplated in this disclosure. Mask data preparation step 1058, which may include a fracturing operation, may also comprise a pattern matching operation to match glyphs to create a mask that matches closely to the mask design.

In some embodiments of this disclosure, mask data preparation step 1058 may include generating overlapping shots so as to produce a higher peak dosage near line ends or near perimeters of square or nearly-square patterns. Mask data preparation step 1058 may include generating a plurality of multi-beam shots, each multi-beam shot comprising one or more beamlets, where dosage areas are determined and dosages assigned to beamlets in each dosage area. In some embodiments, beamlet dosages may vary within a dosage area. In some embodiments, MDP 1058 may include calculating an edge slope of a pattern produced on a surface by an original set of shots; identifying an edge of the pattern which has an edge slope below a target level; and increasing the dosage of a beamlet in a shot in the set of shots to improve the edge slope that is below the target level. In some embodiments, the improved edge slope remains less than the target level. In some embodiments, edge slope calculations may include long-range effects such as backscatter, while in other embodiments long-range effects may not be considered in calculating edge slopes. In some embodiments, dosages in the original set of shots are not increased for edges of the pattern which have edge slopes equal to or above the target level. The target level may be determined by methods including, for example: i) fabricating a test chip based on a test design, and measuring critical dimensions (CD) of the test chip; and ii) simulating an edge slope of a feature that is known to meet a manufacturing variation criterion. The test design may be fabricated for a plurality of process conditions, with the target level of edge slope being determined from the process condition that meets the manufacturing variation criterion. The manufacturing variation criteria may include, for example, critical dimension uniformity, line edge roughness, and line width roughness. In some embodiments, the edge of the pattern which has an edge slope below a target level is a line end, such as a corner of the line end.

Mask data preparation may also comprise inputting patterns to be formed on a surface with the patterns being slightly different, selecting a set of characters to be used to form the number of patterns, the set of characters fitting on a stencil mask, the set of characters possibly including both complex and VSB characters, and the set of characters based on varying character dose or varying character position or applying partial exposure of a character within the set of characters or dragging a character to reduce the shot count or total write time. A set of slightly different patterns on the surface may be designed to produce substantially the same pattern on a substrate. Also, the set of characters may be selected from a predetermined set of characters. In one embodiment of this disclosure, a set of characters available on a stencil in a step 1070 that may be selected quickly during the mask writing step 1062 may be prepared for a specific mask design. In that embodiment, once the mask data preparation step 1058 is completed, a stencil is prepared in a step 1060. In another embodiment of this disclosure, a stencil is prepared in the step 1060 prior to or simultaneous with the MDP step 1058 and may be independent of the particular mask design. In this embodiment, the characters available in the step 1070 and the stencil layout are designed in step 1072 to output generically for many potential mask designs 1056 to incorporate slightly different patterns that are likely to be output by a particular OPC program 1054 or a particular MDP program 1058 or particular types of designs that characterizes the physical design 1052 such as memories, flash memories, system on chip designs, or particular process technology being designed to in physical design 1052, or a particular cell library used in physical design 1052, or any other common characteristics that may form different sets of slightly different patterns in mask design 1056. The stencil can include a set of characters, such as a limited number of characters that was determined in the step 1058, including a set of adjustment characters.

Once the stencil is completed the stencil is used to generate a surface in a mask writer machine, such as an electron beam writer system. This particular step is identified as a step 1062. The electron beam writer system projects a beam of electrons through the stencil onto a surface to form patterns on a surface, as shown in a step 1064. The charged particle beam system for the method of FIG. 11 may be a system that writes a shape onto a surface using a single beam, or may be a multi-beam system that produces multiple beamlets. Thus a "shot" in the present methods may refer to either single or multi-beam shots. The completed surface may then be used in an optical lithography machine, which is shown in a step 1066. Finally, in a step 1068, a substrate such as a silicon wafer is produced. As has been previously described, in step 1070 characters may be provided to the OPC step 1054 or the MDP step 1058. The step 1070 also provides characters to a character and stencil design step 1072 or a glyph generation step 1074. The character and stencil design step 1072 provides input to the stencil step 1060 and to the characters step 1070. The glyph generation step 1074 provides information to a glyphs or parameterized glyphs step 1076. Also, as has been discussed, the glyphs or parameterized glyphs step 1076 provides information to the OPC step 1054 or the MDP step 1058.

Figure 11:
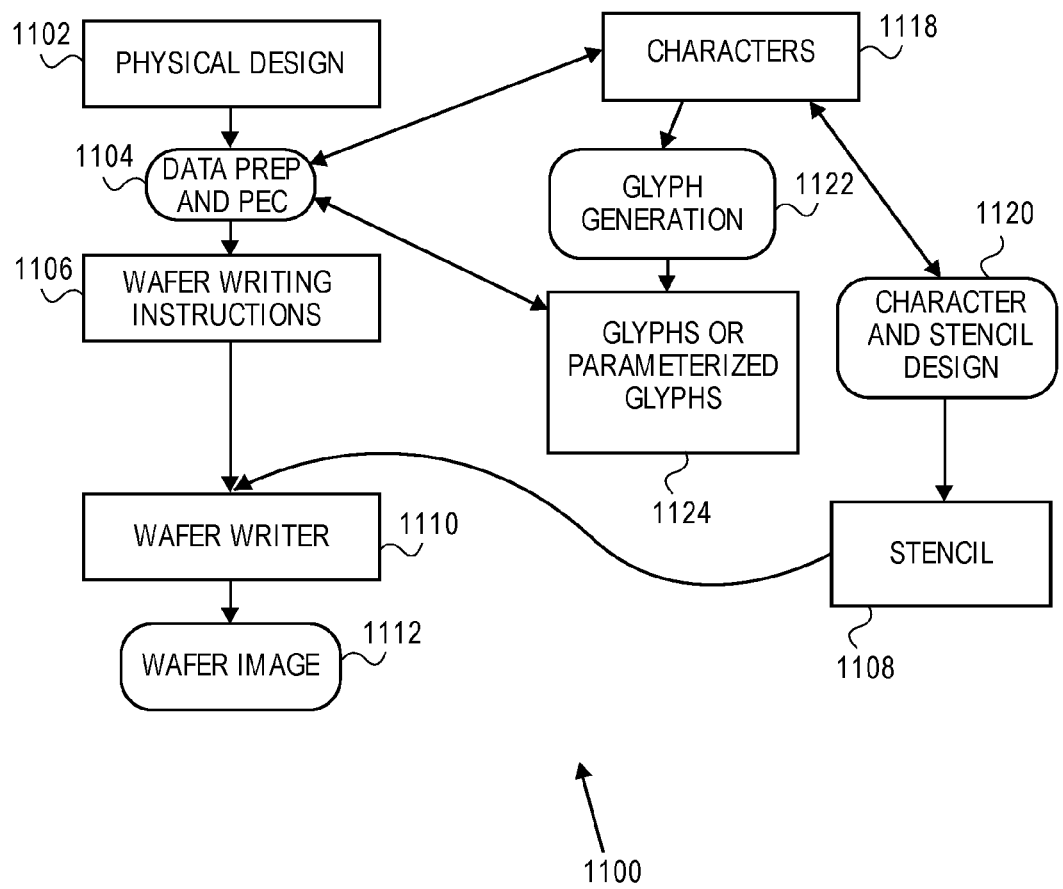
FIG. 11 illustrates a conceptual flow diagram of how to prepare a surface for use in fabricating a substrate such as an integrated circuit on a silicon wafer.

Referring now to FIG. 11, another exemplary conceptual flow diagram 1100 of how to prepare a surface which is directly written on a substrate such as a silicon wafer is shown. In a first step 1102, a physical design, such as a physical design of an integrated circuit is designed. This may be an ideal pattern that the designer wants transferred onto a substrate. Next, in a step 1104, various data preparation (DP) steps, including fracturing and PEC, are performed to prepare input data to a substrate writing device. Step 1104 may include fracturing of the patterns into a set of complex CP and/or VSB shots, where some of the shots may overlap each other. The step 1104 may also comprise inputting possible glyphs or parameterized glyphs from step 1124, the glyphs being based on predetermined characters from step 1118, and the glyphs being determined using a calculation of varying a character dose or varying a character position or applying partial exposure of a character in glyph generation step 1122. The step 1104 may also comprise pattern matching to match glyphs to create a wafer image that matches closely to the physical design created in the step 1102. Iterations, potentially including only one iteration where a correct-by-construction "deterministic" calculation is performed, of pattern matching, dose assignment, and equivalence checking may also be performed.

In some embodiments of this disclosure, data preparation step 1104 may include generating overlapping shots near the line ends or near the perimeters of square or nearly-square patterns. In some embodiments, data preparation step 1104 may include calculating an edge slope of a pattern produced on a surface by an original set of shots; identifying an edge of the pattern which has an edge slope below a target level; and increasing the dosage of a beamlet in a shot in the set of shots to improve the edge slope that is below the target level. In some embodiments, the improved edge slope remains less than the target level. In some embodiments, edge slope calculations may include long-range effects such as backscatter, while in other embodiments long-range effects may not be considered in calculating edge slopes. In some embodiments, dosages in the original set of shots are not increased for edges of the pattern which have edge slopes equal to or above the target level. The target level may be determined by methods including, for example: i) fabricating a test chip based on a test design, and measuring critical dimensions (CD) of the test chip; and ii) simulating an edge slope of a feature that is known to meet a manufacturing variation criterion. The test design may be fabricated for a plurality of process conditions, with the target level of edge slope being determined from the process condition that meets the manufacturing variation criterion. The manufacturing variation criteria may include, for example, critical dimension uniformity, line edge roughness and line width roughness. In some embodiments, the edge of the pattern which has an edge slope below a target level is a line end, such as a corner of the line end.

A stencil is prepared in a step 1108 and is then provided to a wafer writer in a step 1110. Once the stencil is completed the stencil is used to prepare a wafer in a wafer writer machine, such as an electron beam writer system. This step is identified as the step 1110. The electron beam writer system projects a beam of electrons through the stencil onto a surface to form patterns in a surface. The surface is completed in a step 1112.

Further, in a step 1118 characters may be provided to the data preparation and PEC step 1104. The step 1118 also provides characters to a glyph generation step 1122. The character and stencil design step 1120 provides input to the stencil step 1108 or to a character step 1118. The character step 1118 may provide input to the character and stencil design step 1120. The glyph generation step 1122 provides information to a glyphs or parameterized glyphs step 1124. The glyphs or parameterized glyphs step 1124 provides information to the Data Prep and PEC step 1104. The step 1110 may include repeated application as required for each layer of processing, potentially with some processed using the methods described in association with FIG. 10, and others processed using the methods outlined above with respect to FIG. 11, or others produced using any other wafer writing method to produce integrated circuits on the silicon wafer.

The fracturing, mask data preparation, proximity effect correction and glyph creation flows described in this disclosure may be implemented using general-purpose computers using Central Processing Units (CPU) with appropriate computer software as computation devices. Due to the large amount of calculations required, multiple computers or processor cores of a CPU may also be used in parallel. In one embodiment, the computations may be subdivided into a plurality of 2-dimensional geometric regions for one or more computation-intensive steps in the flow, to support parallel processing. In another embodiment, a special-purpose hardware device, either used singly or in multiples, may be used to perform the computations of one or more steps with greater speed than using general-purpose computers or processor cores. Specialty computing hardware devices or processors may include, for example, field-programmable gate arrays (FPGA), application-specific integrated circuits (ASIC), or digital signal processor (DSP) chips. In one embodiment, the special-purpose hardware device may be a graphics processing unit (GPU). In another embodiment, the special-purpose hardware device may be a graphics processing unit (GPU). In another embodiment, the optimization and simulation processes described in this disclosure may include iterative processes of revising and recalculating possible solutions, so as to minimize either the total number of shots, or the total charged particle beam writing time, or some other parameter. In yet another embodiment, an initial set of shots may be determined in a correct-by-construction method, so that no shot modifications are required.

Figure 13:
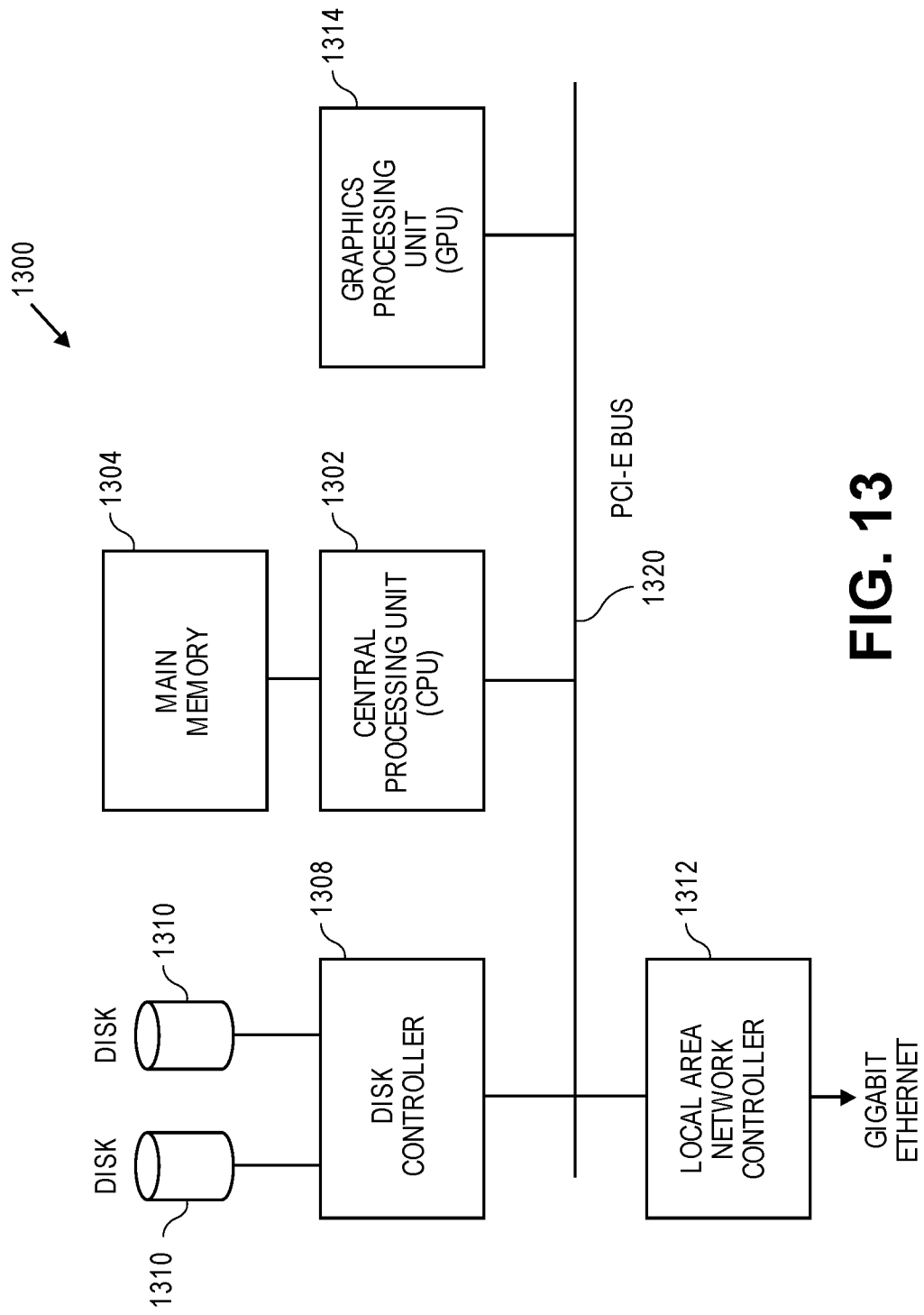
FIG. 13 illustrates an exemplary computing hardware device used in embodiments of the methods.

FIG. 13 illustrates an example of a computing hardware device 1300 that may be used to perform the calculations described in this disclosure. Computing hardware device 1300 comprises a central processing unit (CPU) 1302, with attached main memory 1304. The CPU may comprise, for example, eight processing cores, thereby enhancing performance of any parts of the computer software that are multi-threaded. The size of main memory 1304 may be, for example, 64 G-bytes. The CPU 1302 is connected to a Peripheral Component Interconnect Express (PCIe) bus 1320. A graphics processing unit (GPU) 1314 is also connected to the PCIe bus. In computing hardware device 1300 the GPU 1314 may or may not be connected to a graphics output device such as a video monitor. If not connected to a graphics output device, GPU 1314 may be used purely as a high-speed parallel computation engine. The computing software may obtain significantly-higher performance by using the GPU for a portion of the calculations, compared to using CPU 1302 for all the calculations. The CPU 1302 communicates with the GPU 1314 via PCIe bus 1320. In other embodiments (not illustrated) GPU 1314 may be integrated with CPU 1302, rather than being connected to PCIe bus 1320. Disk controller 1308 may also be attached to the PCIe bus, with, for example, two disks 1310 connected to disk controller 1308. Finally, a local area network (LAN) controller 1312 may also be attached to the PCIe bus, and provides Gigabit Ethernet (GbE) connectivity to other computers. In some embodiments, the computer software and/or the design data are stored on disks 1310. In other embodiments, either the computer programs or the design data or both the computer programs and the design data may be accessed from other computers or file serving hardware via the GbE Ethernet.

While the specification has been described in detail with respect to specific embodiments, it will be appreciated that those skilled in the art, upon attaining an understanding of the foregoing, may readily conceive of alterations to, variations of, and equivalents to these embodiments. These and other modifications and variations to the present methods for fracturing, mask data preparation, and proximity effect correction may be practiced by those of ordinary skill in the art, without departing from the scope of the present subject matter, which is more particularly set forth in the appended claims. Furthermore, those of ordinary skill in the art will appreciate that the foregoing description is by way of example only, and is not intended to be limiting. Steps can be added to, taken from or modified from the steps in this specification without deviating from the scope of the invention. In general, any flowcharts presented are only intended to indicate one possible sequence of basic operations to achieve a function, and many variations are possible. Thus, it is intended that the present subject matter covers such modifications and variations as come within the scope of the appended claims and their equivalents.

What is claimed is:

1. A method for fracturing or mask data preparation comprising:

inputting an original set of shots for a multi-beam charged particle beam writer, wherein each multi-beam shot in the original set of shots comprises at least one beamlet; and dosages for the original set of shots have not been corrected for long-range effects;

calculating an edge slope of a pattern produced on a resist-coated surface by the original set of shots;

identifying an edge of the pattern which has an edge slope below a target level;

increasing the dosage of a beamlet in a shot in the original set of shots to improve the edge slope of the edge that has the edge slope below the target level, wherein the improved edge slope is closer to, without exceeding, the target level, wherein the resist comprises a resist threshold, and wherein the edge slope comprises a slope of the dosage, at the resist threshold, with respect to a linear dimension perpendicular to the edge of the pattern; and outputting a revised set of shots to the multi-beam charged particle beam writer, wherein the revised set of shots revises the original set of shots with the increased dosage of a beamlet in a shot in the original set of shots.

2. The method of claim 1 wherein dosages in the original set of shots are not increased for edges of the pattern which have edge slopes equal to or above the target level.

3. The method of claim 1 wherein the target level is determined by one of i) fabricating a test chip based on a test design, and measuring critical dimensions (CD) of the test chip; and ii) simulating an edge slope of a feature that is known to meet a manufacturing variation criterion.

4. The method of claim 3 wherein the test design is fabricated for a plurality of process conditions, and the target level of edge slope is determined from the process condition that meets the manufacturing variation criterion.

5. The method of claim 4, wherein the manufacturing variation criterion comprises one of the group consisting of: critical dimension uniformity, line edge roughness and line width roughness.

6. The method of claim 1, wherein the edge of the pattern which has an edge slope below a target level is a line end.

7. The method of claim 6, wherein the edge of the pattern which has the edge slope below the target level is a corner of the line end.

8. A method for fracturing or mask data preparation or proximity effect correction comprising:
   inputting an original set of shots for a multi-beam charged particle beam writer, wherein each multi-beam shot in the original set of shots comprises at least one beamlet;
   calculating an edge slope of a pattern produced on a resist-coated surface by the original set of shots, including correction for long-range effects;
   identifying an edge in the pattern which has an edge slope below a target level;
   increasing the dosage of a beamlet in a shot in the original set of shots to improve the edge slope of the edge that has the edge slope below the target level, wherein the improved edge slope is closer to, without exceeding, the target level, wherein the resist comprises a resist threshold, and wherein the edge slope comprises a slope of the dosage, at the resist threshold, with respect to a linear dimension perpendicular to the edge of the pattern; and
   outputting a revised set of shots to the multi-beam charged particle beam writer, wherein the revised set of shots revises the original set of shots with the increased dosage of a beamlet in a shot in the original set of shots.

9. The method of claim 8 wherein dosages in the original set of shots are not increased for edges of the pattern which have edge slopes equal to or above the target level.

10. The method of claim 8 wherein the long-range effects include backscattering and fogging.

11. A method for fracturing or mask data preparation or proximity effect correction comprising:
   determining a plurality of shots for a multi-beam charged particle beam writer, wherein each shot in the plurality of shots comprises at least one beamlet, wherein the plurality of shots forms a pattern on a resist-coated surface, wherein the step of determining comprises calculating an edge slope of the pattern formed from the plurality of shots before correction for long-range effects;
   identifying an edge of the pattern which has an edge slope below a target level;
   increasing the dosage of a beamlet in a shot in the plurality of shots to improve the edge slope of the edge that has the edge slope below the target level, wherein the improved edge slope is closer to, without exceeding, the target level, wherein the resist comprises a resist threshold, and wherein the edge slope comprises a slope of the dosage, at the resist threshold, with respect to a linear dimension perpendicular to the edge of the pattern; and
   outputting a revised plurality of shots to the multi-beam charged particle beam writer, wherein the revised plurality of shots revises the plurality of shots with the increased dosage of a beamlet in a shot in the plurality of shots.

12. The method of claim 11 wherein the improved edge slope remains less than the target level.

13. The method of claim 11 wherein dosage is not increased for edges of the pattern which have edge slopes equal to or above the target level.

14. A method for fracturing or mask data preparation or proximity effect correction comprising:
   determining a plurality of shots for a multi-beam charged particle beam writer, wherein each shot in the plurality of shots comprises at least one beamlet, wherein the plurality of shots forms a pattern on a resist-coated surface;
   performing proximity effect correction (PEC) to correct shot dosages for long-range effects for the plurality of shots;
   calculating an edge slope of the pattern formed from the plurality of shots on a resist-coated surface;
   identifying an edge of the pattern which has an edge slope below a target level;
   increasing the dosage of a beamlet in a shot in the plurality of shots to improve the edge slope of the edge that has the edge slope below the target level, wherein the improved edge slope is closer to, without exceeding, the target level, wherein the resist comprises a resist threshold, and wherein the edge slope comprises a slope of the dosage, at the resist threshold, with respect to a linear dimension perpendicular to the edge of the pattern; and
   outputting a revised set of shots to the multi-beam charged particle beam writer, wherein the revised set of shots revises the original set of shots with the increased dosage of a beamlet in a shot in the original set of shots.

15. The method of claim 14 wherein the increasing the dosage results in a modified plurality of shots, and wherein the method further comprises performing proximity effect correction (PEC) on the modified plurality of shots.

16. The method of claim 14 wherein the improved edge slope remains less than the target level.

* * * * *